United States Patent
Wang et al.

(10) Patent No.: US 11,783,782 B2
(45) Date of Patent: Oct. 10, 2023

(54) DISPLAY SUBSTRATE, DISPLAY DEVICE AND DISPLAY DRIVING METHOD

(71) Applicants: Chengdu BOE Optoelectronics Technology Co., Ltd., Chengdu (CN); BOE Technology Group Co., Ltd., Beijing (CN)

(72) Inventors: Wenkang Wang, Beijing (CN); Yongfu Diao, Beijing (CN); Zhongliu Yang, Beijing (CN); Chenyu Chen, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 502 days.

(21) Appl. No.: 17/040,111

(22) PCT Filed: Nov. 1, 2019

(86) PCT No.: PCT/CN2019/115077
§ 371 (c)(1),
(2) Date: Sep. 22, 2020

(87) PCT Pub. No.: WO2021/081990
PCT Pub. Date: May 6, 2021

(65) Prior Publication Data
US 2023/0107029 A1 Apr. 6, 2023

(51) Int. Cl.
*G09G 3/3266* (2016.01)
*G09G 3/3233* (2016.01)

(52) U.S. Cl.
CPC .......... *G09G 3/3266* (2013.01); *G09G 3/3233* (2013.01); *G09G 2300/0408* (2013.01);
(Continued)

(58) Field of Classification Search
None
See application file for complete search history.

(56) References Cited

U.S. PATENT DOCUMENTS

| 10,339,869 | B1 | 7/2019 | Li |
| 2008/0117159 | A1 | 5/2008 | Cheng |

(Continued)

FOREIGN PATENT DOCUMENTS

| CN | 106097968 A | 11/2016 |
| CN | 107644604 A | 1/2018 |

OTHER PUBLICATIONS

Extended European Search Report issued on Oct. 21, 2022 for application No. EP19944645.1.
(Continued)

*Primary Examiner* — Nitin Patel
*Assistant Examiner* — Amen W Bogale
(74) *Attorney, Agent, or Firm* — Nath, Goldberg & Meyer; Joshua B. Goldberg

(57) ABSTRACT

The present disclosure provides a display substrate, including a display area and a peripheral area, where N pixel unit groups are arranged in the display area, and each pixel unit group is provided with a gate line, a first reset signal line and a second reset signal line; a driving module is arranged in the peripheral area and includes at least two driving circuits, at least two operating signal line groups are further arranged in the peripheral area, the driving circuits and the operating signal line groups are alternately arranged the at least two driving circuits include a gate driving circuit and a reset driving circuit provided with N second signal output terminals, the ith second signal output terminal is coupled to the second reset signal line configured for the ith pixel unit group and the first reset signal line configured for the (i+1)th pixel unit group.

18 Claims, 9 Drawing Sheets

(52) U.S. Cl.
CPC ............. *G09G 2300/0426* (2013.01); *G09G 2300/0819* (2013.01); *G09G 2300/0852* (2013.01); *G09G 2310/0213* (2013.01); *G09G 2310/0281* (2013.01); *G09G 2310/0286* (2013.01); *G09G 2310/061* (2013.01); *G09G 2310/08* (2013.01)

(56) References Cited

U.S. PATENT DOCUMENTS

| | | | |
|---|---|---|---|
| 2011/0187682 | A1 | 8/2011 | Kim et al. |
| 2015/0002560 | A1* | 1/2015 | Kwon et al. ......... G09G 3/3266 345/691 |
| 2015/0269889 | A1 | 9/2015 | Hsu et al. |
| 2016/0328037 | A1 | 11/2016 | Zhuang et al. |
| 2017/0092200 | A1 | 3/2017 | Park et al. |
| 2018/0113367 | A1 | 4/2018 | Hou et al. |
| 2018/0144685 | A1* | 5/2018 | Gong et al. ........ H10K 59/1213 |
| 2020/0251057 | A1* | 8/2020 | Sun et al. ............ G09G 3/3275 |
| 2020/0273411 | A1* | 8/2020 | Gao et al. ............ G09G 3/3233 |
| 2021/0272985 | A1* | 9/2021 | Kim et al. ............ H01L 27/124 |
| 2021/0280132 | A1* | 9/2021 | Gao et al. ............ G09G 3/3233 |
| 2021/0304678 | A1* | 9/2021 | Wang et al. ......... G09G 3/3275 |
| 2021/0327361 | A1* | 10/2021 | Park et al. ........... G09G 3/3266 |
| 2022/0115482 | A1* | 4/2022 | Yang et al. .......... H10K 59/131 |
| 2022/0335892 | A1* | 10/2022 | Zhang ................. G09G 3/3233 |
| 2022/0335894 | A1* | 10/2022 | Zhou et al. .......... G09G 3/3258 |
| 2022/0366834 | A1* | 11/2022 | Xia et al. ................ G09G 3/32 |

OTHER PUBLICATIONS

First Office Action issued on Jun. 15, 2022 Indian application No. 202147052768.

* cited by examiner

DISPLAY SUBSTRATE, DISPLAY DEVICE AND DISPLAY DRIVING METHOD

This is a National Phase Application filed under 35 U.S.C. 371 as a national stage of PCT/CN2019/115077, filed Nov. 1, 2019, the content of which is hereby incorporated by reference in its entirety.

TECHNICAL FIELD

The present disclosure relates to a display substrate, a display device, and a display driving method.

BACKGROUND

Generally, for each type of driving signal lines (e.g., gate lines, light-emitting control signal lines, different types of reset signal lines, etc.) in a display area, a corresponding driving circuit is disposed in a peripheral area surrounding the display area; for example, in response to that there are four types of driving signal lines in the display area, four independent driving circuits need to be arranged in the peripheral area. As the number of types of the driving signal lines increases, the number of driving circuits to be arranged in the peripheral area increases, which is not favorable for realizing a narrow bezel.

SUMMARY

Embodiments of the present disclosure provide a display substrate, a display device and a display driving method.

In a first aspect, an embodiment of the present disclosure provides a display substrate, including: a display area and a peripheral area surrounding the display area, wherein a plurality of pixel units which are arranged in an array mode are arranged in the display area, all the pixel units are divided into N pixel unit groups, N is an integer and is greater than or equal to 2, and each pixel unit group is provided with a corresponding gate line, a first reset signal line and a second reset signal line;
  a driving module is arranged in the peripheral area, the driving module includes at least two driving circuits, at least two operating signal line groups corresponding to the driving circuits in one-to-one mode are further arranged in the peripheral area, each operating signal line group includes at least two operating signal lines, and the operating signal lines are configured to provide electric signals for the corresponding driving circuits;
  the driving circuits and the operating signal line groups are alternately arranged, and each driving circuit is adjacent to the operating signal line group corresponding thereto;
  the at least two driving circuits include: a gate driving circuit and a reset driving circuit, and the gate driving circuit is provided with N first signal output terminals capable of sequentially outputting gate scanning signals, and the reset driving circuit is provided with N second signal output terminals capable of sequentially outputting reset scanning signals;
  the $i^{th}$ first signal output terminal is coupled to the gate line configured for the $i^{th}$ pixel unit group, the $i^{th}$ second signal output terminal is coupled to the second reset signal line configured for the $i^{th}$ pixel unit group and the first reset signal line configured for the $(i+1)^{th}$ pixel unit group, the $n^{th}$ first signal output terminal and the $n^{th}$ second signal output terminal are respectively coupled to the gate line and the second reset signal line configured for the $n^{th}$ pixel unit group, wherein i is an integer and is greater than or equal to 1 and less than or equal to N-1.

In some implementations, the gate driving circuit includes N first shift registers coupled in cascade, and the reset driving circuit includes N second shift registers coupled in cascade;
  a signal output terminal of the first shift register at $j^{th}$ stage is the $j^{th}$ first signal output terminal;
  a signal output terminal of the second shift register at $j^{th}$ stage is the $J^{th}$ second signal output terminal;
  where j is an integer and is greater than or equal to 1 and less than or equal to N.

In some implementations, the N pixel unit groups are arranged in a first direction;
  the gate line, the first reset signal line and the second reset signal line all extend along a second direction;
  the N first shift registers in the gate driving circuit are arranged along the first direction, and the N first shift registers in the reset driving circuit are arranged along the first direction;
  the first direction intersects the second direction.

In some implementations, the first shift register includes: a first input sub-circuit, a first pull-down control sub-circuit, a first output sub-circuit and a first pull-down sub-circuit;
  the first input sub-circuit is coupled to an input signal terminal, a pull-up node and a first clock signal terminal and is configured to write an input signal provided by the input signal terminal into the pull-up node in response to control of the first clock signal terminal;
  the first pull-down control sub-circuit is coupled to a first operating voltage terminal, the pull-up node, a pull-down node and the first clock signal terminal, and is configured to write a first operating voltage provided by the first operating voltage terminal into the pull-down node in response to control of the first clock signal terminal, and write a first clock signal provided by the first clock signal terminal into the pull-down node in response to control of a voltage at the pull-up node;
  the first output sub-circuit is coupled to a second operating voltage terminal, the pull-up node, the pull-down node, a signal output terminal and a second clock signal terminal, and is configured to write a second clock signal provided by the second clock signal terminal into the signal output terminal in response to control of the voltage at the pull-up node and write a second operating voltage provided by the second operating voltage terminal into the signal output terminal in response to control of the pull-down node;
  the first pull-down sub-circuit is coupled to the second operating voltage terminal, the pull-up node, the pull-down node and the second clock signal terminal, and is configured to write the second operating voltage into the pull-up node in response to control of a voltage at the pull-down node and control of the second clock signal terminal.

In some implementations, the operating signal line group corresponding to the gate driving circuit includes: a first clock signal line, a second clock signal line, a third clock signal line, and a fourth clock signal line;
  the first clock signal terminal of the first shift register at $(4k-3)^{th}$ stage is coupled to the first clock signal line, and the second clock signal terminal of the first shift register at $(4k-3)^{th}$ stage is coupled to the second clock signal line;
  the first clock signal terminal of the first shift register at $(4k-2)^{th}$ stage is coupled to the second clock signal line, and the second clock signal terminal of the first shift register at (4k-2)$^{th}$ stage is coupled to the first clock signal line;

the first clock signal terminal of the first shift register at (4k-1)$^{th}$ stage is coupled to the third clock signal line, and the second clock signal terminal of the first shift register at (4k-1)$^{th}$ stage is coupled to the fourth clock signal line;

the first clock signal terminal of the first shift register at 4k$^{th}$ stage is coupled to the fourth clock signal line, and the second clock signal terminal of the first shift register at 4k$^{th}$ stage is coupled to the third clock signal line;

wherein k is an integer and is greater than or equal to 1 and less than or equal to N/4;

a time period during which the clock signal provided by the first clock signal line is at an active level is staggered from a time period during which the clock signal provided by the second clock signal line is at an active level;

the first clock signal line and the third clock signal line provide clock signals the same as each other, and the second clock signal line and the fourth clock signal line provide clock signals the same as each other.

In some implementations, a circuit of the second shift register is the same as a circuit of the first shift register.

In some implementations, the operating signal line group corresponding to the reset driving circuit includes: a fifth clock signal line and a sixth clock signal line;

the first clock signal terminal of the second shift register at (2m-1)$^{th}$ stage is coupled to the fifth clock signal line, and the second clock signal terminal of the second shift register at (2m-1)$^{th}$ stage is coupled to the sixth clock signal line;

the first clock signal terminal of the second shift register at 2m$^{th}$ stage is coupled to the sixth clock signal line, and the second clock signal terminal of the second shift register at the 2m$^{th}$ stage is coupled to the fifth clock signal line;

wherein m is an integer and is greater than or equal to 1 and less than or equal to N/2;

a time period during which the clock signal provided by the fifth clock signal line is at an active level is staggered from a time period during which the clock signal provided by the sixth clock signal line is at an active level.

In some implementations, each of the pixel unit groups is configured with a corresponding light-emitting control signal line;

the driving module further includes a light-emitting control driving circuit which is provided with N third signal output terminals capable of sequentially outputting light-emitting control scanning signals;

the j$^{th}$ first signal output terminal is coupled to a light-emitting control signal line configured for the j$^{th}$ pixel unit group, j is an integer and is greater than or equal to 1 and less than or equal to N.

In some implementations, the light-emitting control driving circuit includes N third shift registers coupled in cascade;

the signal output terminal of the third shift register at j$^{th}$ stage is the j$^{th}$ third signal output terminal.

In some implementations, the N pixel unit groups are arranged in a first direction;

the N third shift registers in the light-emitting control driving circuit are arranged along the first direction.

In some implementations, the N pixel unit groups are arranged in a first direction;

within the driving module, the gate driving circuit, the reset driving circuit and the light-emitting control driving circuit are arranged in a second direction;

the first direction intersects the second direction.

In some implementations, two driving modules are provided, and the two driving modules are respectively located at opposite sides of the display area.

In some implementations, the pixel unit includes: a pixel circuit and a light-emitting device, the pixel circuit includes a first reset sub-circuit, a second reset sub-circuit, a data writing sub-circuit, a threshold compensation sub-circuit, and a driving transistor;

the first reset sub-circuit is coupled to a first power supply terminal, a control electrode of the driving transistor and the first reset signal line corresponding thereto, and is configured to write a first voltage provided by the first power supply terminal into the control electrode of the driving transistor in response to control of the first reset signal line;

the second reset sub-circuit is coupled to the first power supply terminal, a first terminal of the light-emitting device and the second reset signal line corresponding thereto, and is configured to write the first voltage into the first terminal of the light-emitting device in response to control of the second reset signal line;

the data writing sub-circuit is coupled to a first electrode of the driving transistor, the data line corresponding thereto and the gate line corresponding thereto and is configured to write a data voltage provided by the data line into the first electrode of the driving transistor in response to control of the gate line;

the threshold compensation sub-circuit is coupled to a second power supply terminal, the control electrode of the driving transistor, the first electrode of the driving transistor, a second electrode of the driving transistor and the gate line corresponding thereto, and is configured to write a data compensation voltage into the control electrode of the driving transistor in response to control of the gate line, wherein the data compensation voltage is equal to a sum of the data voltage and a threshold voltage of the driving transistor;

the second electrode of the driving transistor is coupled to the first terminal of the light-emitting device, and the driving transistor is configured to output a corresponding driving current in response to control of the data compensation voltage;

a second terminal of the light-emitting device is coupled to a third power supply terminal.

In some implementations, the first reset sub-circuit includes a first transistor, the second reset sub-circuit includes a second transistor, the data writing sub-circuit includes a third transistor, the threshold compensation sub-circuit includes a fourth transistor and a fifth transistor;

a control electrode of the first transistor is coupled to the first reset signal line, a first electrode of the first transistor is coupled to the first power supply terminal, and a second electrode of the first transistor is coupled to the control electrode of the driving transistor;

a control electrode of the second transistor is coupled to the second reset signal line, a first electrode of the second transistor is coupled to the first power supply terminal, and a second electrode of the second transistor is coupled to the first terminal of the light-emitting device;

a control electrode of the third transistor is coupled to the gate line, a first electrode of the third transistor is coupled to the data line, and a second electrode of the third transistor is coupled to the first electrode of the driving transistor;

a control electrode of the fourth transistor is coupled to the light-emitting control signal line, a first electrode of the fourth transistor is coupled to the second power supply terminal, and a second electrode of the fourth transistor is coupled to the first electrode of the driving transistor;

a control electrode of the fifth transistor is coupled to the gate line, a first electrode of the fifth transistor is coupled to the control electrode of the driving transistor, and a second electrode of the fifth transistor is coupled to the second electrode of the driving transistor.

In some implementations, each of the pixel unit groups is configured with a corresponding light-emitting control signal line, the pixel circuit further including: a sixth transistor through which the second electrode of the driving transistor is coupled to the first terminal of the light-emitting device;

a control electrode of the sixth transistor is coupled to the light-emitting control signal line, a first electrode of the sixth transistor is coupled to the second electrode of the driving transistor, and a second electrode of the sixth transistor is coupled to the first terminal of the light-emitting device.

In a second aspect, an embodiment of the present disclosure further provides a display device, including: the display substrate provided in the above embodiment.

In a third aspect, an embodiment of the present disclosure further provides a display driving method, where the display driving method is based on the display substrate provided in the foregoing embodiment, and the display driving method includes:

sequentially outputting, by the gate driving circuit, gate scanning signals through N first signal output terminals, sequentially outputting, by the reset driving circuit, reset scanning signals through N second signal output terminals, and a scanning timing of the second reset signal line configured for the $i^{th}$ pixel unit group is the same as a scanning timing of the first reset signal line configured for the $(i+1)^{th}$ pixel unit group.

In some implementations, a scanning timing of the gate line configured for the $i^{th}$ pixel unit group is the same as a scanning timing of the second reset signal line configured for the $i^{th}$ pixel unit group.

DESCRIPTION OF EMBODIMENTS

Figure 1:
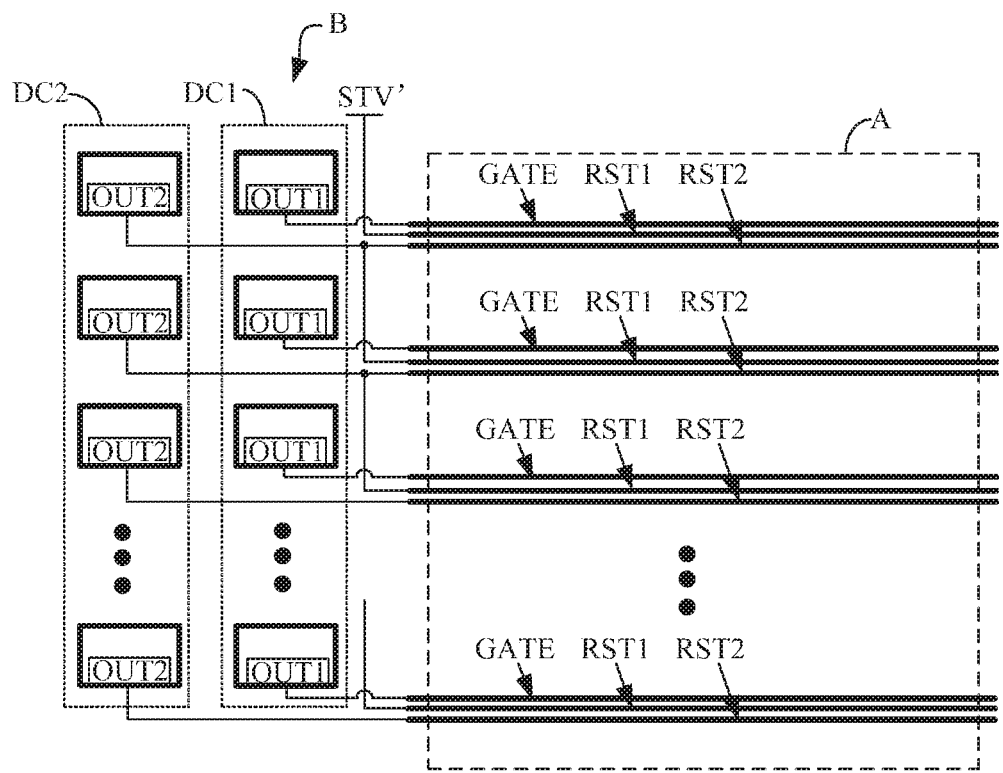
FIG. 1 is a schematic structural diagram of a display substrate according to an embodiment of the present disclosure.

In order to make those skilled in the art better understand technical solutions of the present disclosure, a display substrate, a display device and a display driving method provided in the present disclosure are described in detail below with reference to the accompanying drawings.

Example embodiments will be described more fully hereinafter with reference to the accompanying drawings, but they may be embodied in different forms and should not be construed as limited to the embodiments set forth herein. Rather, these embodiments are provided to make the present disclosure be thorough and complete, and will fully convey the scope of the present disclosure to those skilled in the art.

The terminologies used herein are for a purpose of describing particular embodiments only and are not intended to limit the present disclosure. As used herein, the singular forms "a", "an" and "the" are intended to include the plural forms as well, unless the context clearly indicates otherwise. It will be further understood that the terms "comprises/includes" and/or "comprising/including", when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements/instructions/requests, these elements/instructions/requests should not be limited by these terms. These terms are only used to distinguish one element/instruction/request from another element/instruction/request.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

It should be noted that the transistors used in the embodiments of the present disclosure may be thin film transistors or field effect transistors or other devices with the same or similar characteristics, and since the source electrode and the drain electrode of the transistor used are symmetrical, there is no difference between the source electrode and the drain electrode. In the embodiments of the present disclosure, to distinguish the source electrode and the drain electrode of the transistor, one of the electrodes is referred to as a first electrode, the other electrode is referred to as a second electrode, and the gate electrode is referred to as a control electrode. In addition, the transistors can be divided into N-type transistors and P-type transistors according to characteristics of the transistors, and in the following embodiments, P-type transistors are used for explanation, when P-type transistors are used, the first electrode is the drain electrode of the P-type transistor, the second electrode is the source electrode of the P-type transistor, and an opposite is for the N-type. It is contemplated that the implementations of the following embodiments using the N-type transistors will be easily contemplated by those skilled in the art without inventive effort, and therefore are within the scope of embodiments of the present disclosure.

An "active level" in the present disclosure refers to a level that can control a corresponding transistor to be turned on; specifically, for a P-type transistor, the corresponding active level is a low level; for an N-type transistor, the corresponding active level is a high level.

In order to implement a narrow bezel design, there is provided a technical solution in the related art, in which a gate line and a reset signal line share the same driving circuit, and at this time, although the number of driving circuits is effectively reduced, since the time for performing a reset processing on a node or a terminal in the pixel unit must be consistent with the time for performing a data writing and a threshold compensation processing, the reset processing (generally, the time period required for the reset processing is longer than the time period for performing the data writing and the threshold compensation processing) is not facilitated; in addition, the driving circuit being shared is very easy to cause an output instability due to overlarge load, and further causes abnormal driving processing for the pixel unit.

In view of the foregoing problems, an embodiment of the present disclosure provides a display substrate, and FIG. 1 is a schematic structural diagram of a display substrate provided in an embodiment of the present disclosure, as shown in FIG. 1, the display substrate includes: a display area A (active area, which may also be referred to as a display effective area or AA area) and a peripheral area B surrounding the display area A, a plurality of pixel units in an array are arranged in the display area A, all the pixel units are divided into N pixel unit groups, N is an integer and N is greater than or equal to 2, and each pixel unit group is configured with a corresponding gate line GATE, a first reset signal line RST1 and a second reset signal line RST2.

A driving module (driver block) is arranged in the peripheral area B, the driving module includes at least two driving circuits, at least two operating signal line groups which are in one-to-one correspondence with the driving circuits are further arranged in the peripheral area B, each operating signal line group includes at least two operating signal lines, and the operating signal lines are configured to provide electric signals for the corresponding driving circuits; the driving circuits and the operating signal line groups are alternately arranged, and each driving circuit is adjacent to the operating signal line group corresponding thereto; for a description of the operating signal line group, reference is made to the following.

In the present disclosure, the at least two driving circuits include: a gate driving circuit DC1 and a reset driving circuit DC2, the gate driving circuit DC1 is configured with N first signal output terminals OUT1 capable of sequentially outputting gate scanning signals, and the reset driving circuit DC2 is configured with N second signal output terminals OUT2 capable of sequentially outputting reset scanning signals, wherein i is an integer and is greater than or equal to 1 and less than or equal to N-1.

With the above configurations, the scanning timing of the second reset signal line RST2 arranged for the $i^{th}$ pixel unit group can be made the same as the scanning timing of the first reset signal line RST1 arranged for the $(i+1)^{th}$ pixel unit group.

In the present disclosure, the driving circuits in the driving module are all formed on the display substrate by a GOA (Gate Drive On Array) process, and the specific process flow is not described in detail herein.

The $i^{th}$ first signal output terminal OUT1 is coupled to the gate line GATE for the $i^{th}$ pixel unit group, and the $i^{th}$ second signal output terminal OUT2 is coupled to the second reset signal line RST2 for the $i^{th}$ pixel unit group and the first reset signal line RST1 for the $(i+1)^{th}$ pixel unit group. The $N^{th}$ first signal output terminals OUT1 and the $N^{th}$ second signal output terminals OUT2 are coupled to the gate line GATE and the second reset signal line RST2 for the $N^{th}$ pixel unit group, respectively. That is, in the gate driving circuit DC1, the first signal output terminals OUT1 are coupled to the gate lines GATE of the corresponding the pixel unit groups in one-to-one correspondence; in the reset driving circuit DC2, each of the first to $(N-1)^{th}$ second signal output terminals OUT2 is coupled to the second reset signal line RST2 of a corresponding pixel unit and to the first reset signal line RST1 of a pixel unit next to the corresponding pixel unit, and the $N^{th}$ second signal output terminal OUT2 is coupled to only the second reset signal line RST2 for the $N^{th}$ pixel unit.

As can be seen, only two driving circuits need to be arranged for three different types of driving signal lines (the gate line GATE, the first reset signal line RST1, and the second reset signal line RST2) in the display area A, and the number of driving circuits to be arranged can be effectively reduced. The driving circuits and the operating signal line groups are alternately arranged, each driving circuit is adjacent to the operating signal line group corresponding thereto, and such layout mode can also reduce an area for wiring to a certain extent, thereby is beneficial to realizing a narrow bezel.

Meanwhile, the reset driving circuit DC2 for outputting the reset scanning signal and the gate driving circuit DC1 for outputting the gate scanning signal exist as two independent driving circuits, so that the time for the reset processing and the time for the data writing and the threshold compensation processing in the pixel unit can be separately controlled, thereby ensuring a sufficient execution of the reset processing.

In addition, the reset driving circuit DC2 is used only for supplying scanning signals to two different types of driving signal lines (the first reset signal line RST1 and the second reset signal line RST2), and the gate driving circuit DC1 is used only for supplying scanning signals to one type of driving signal line (the gate line GATE), and therefore loads on the reset driving circuit DC2 and the GATE driving circuit DC1 are both small, and a stable output is possible.

Figure 2:
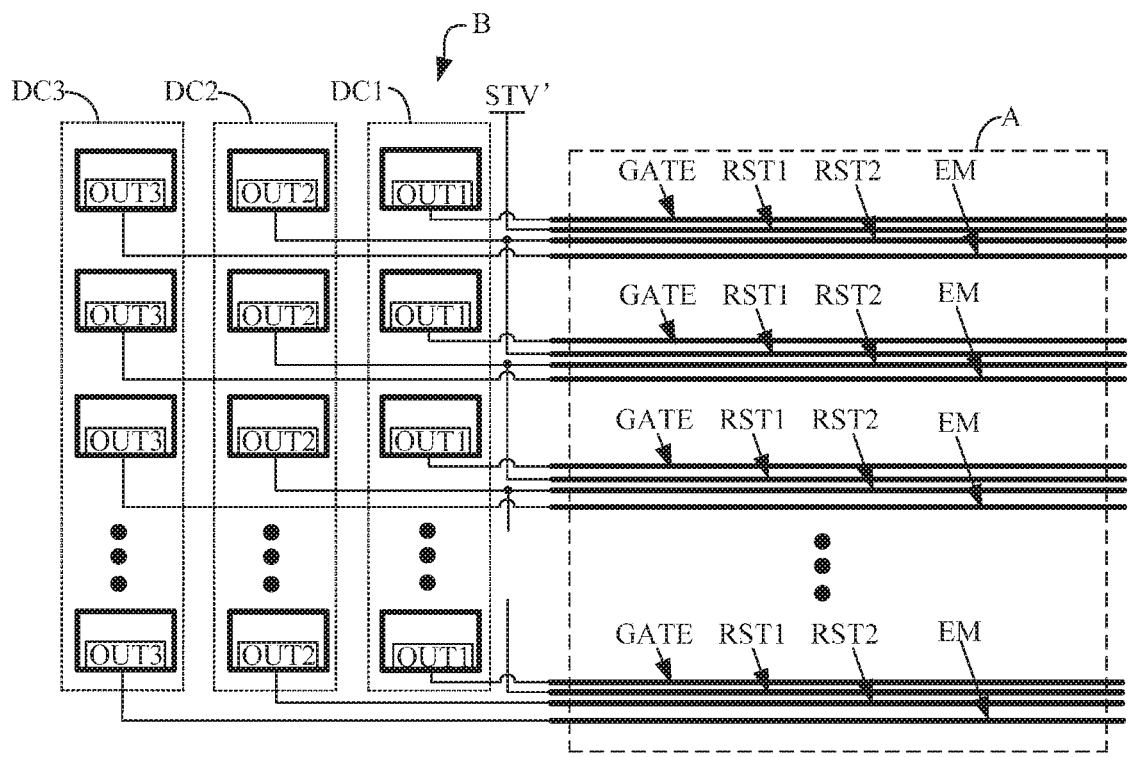
FIG. 2 is a schematic structural diagram of a display substrate according to another embodiment of the present disclosure.

FIG. 2 is a schematic structural diagram of a display substrate provided in another embodiment of the present disclosure, and as shown in FIG. 2, unlike the previous embodiment, each pixel unit group in the present embodiment is configured with not only the corresponding gate line GATE, the first reset signal line RST1 and the second reset signal line RST2, but also a corresponding light-emitting control signal line EM; the driving module includes not only the gate driving circuit DC1 and the reset driving circuit DC2 but also a light-emitting control driving circuit DC3. That is, only three driving circuits need to be arranged for the four different types of driving signal lines (the gate line GATE, the first reset signal line RST1, the second reset signal line RST2, and the light-emitting control signal line EM) in the display area A.

In some implementations, the light-emitting control driving circuit DC3 is configured with N third signal output terminals OUT3 capable of sequentially outputting light-emitting control scanning signals; the $j^{th}$ first signal output terminal OUT1 is coupled to the light-emitting control signal line EM configured for the $j^{th}$ pixel unit group, j is an integer and is greater than or equal to 1 and less than or equal to N.

Figure 3:
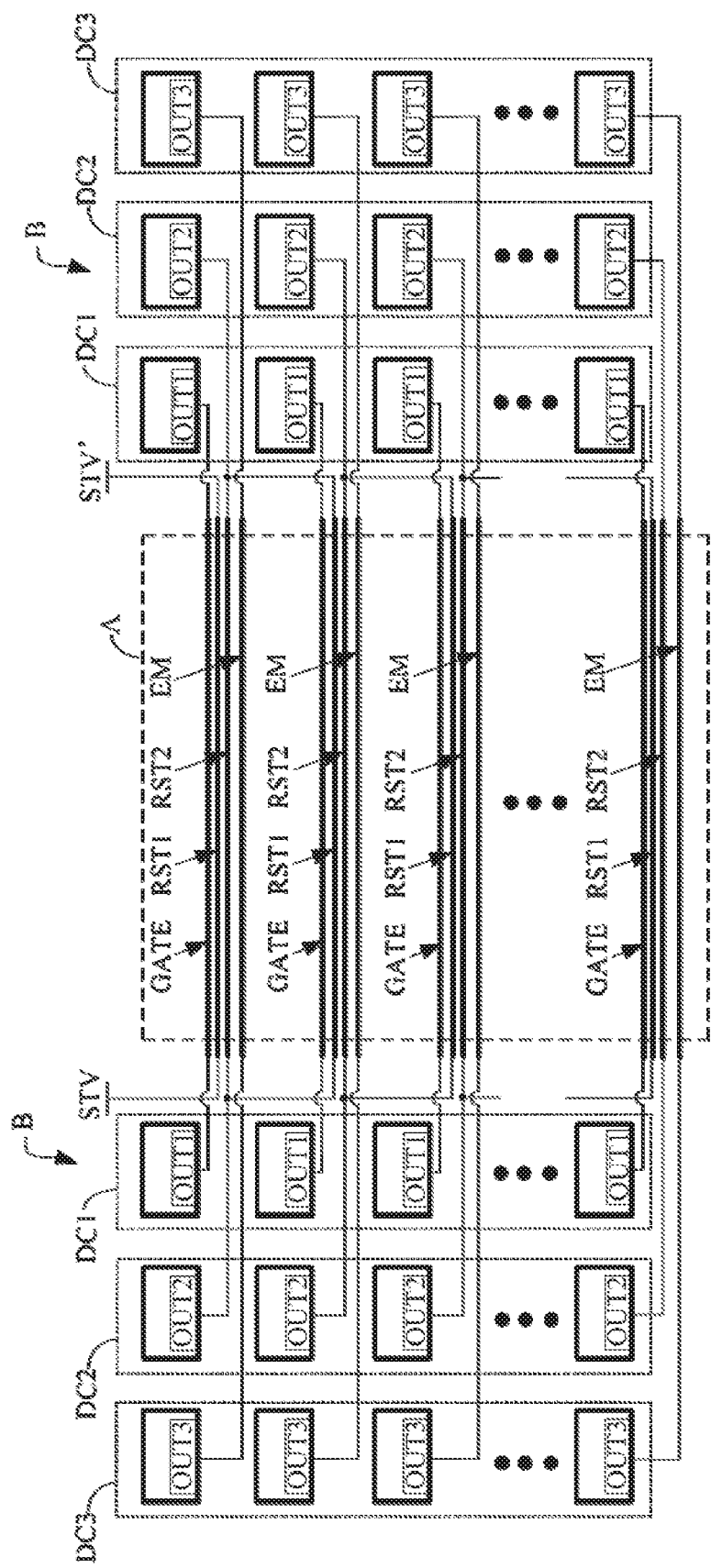
FIG. 3 is a schematic structural diagram of a display substrate according to further another embodiment of the present disclosure.

FIG. 3 is a schematic structural diagram of a display substrate provided in further another embodiment of the present disclosure, as shown in FIG. 3, in some implementations, two driving modules are provided, and the two driving modules are respectively located on opposite sides of the display area A. By providing the driving modules at opposite sides (e.g., left and right sides as shown in the drawing) of the display area A, respectively, a charging speed for each driving signal line can be increased.

In some implementations, one pixel unit group refers to one row of pixel units in the display area A, and the one row of pixel units share a single gate line GATE, a single first reset signal line RST1, a single second reset signal line RST2, and a single light-emitting control signal line EM.

In some implementations, all the pixel unit groups are arranged in a first direction, each of the gate line GATE, the first reset signal line RST1, the second reset signal line RST2, and the light-emitting control signal line EM extend in a second direction, and the first direction intersects the second direction.

In the drawings, the first direction is specifically a column direction, and the second direction is specifically a row direction.

The pixel unit and the driving module in the display substrate provided by the embodiment of the present disclosure will be exemplarily described below with reference to the accompanying drawings.

In general, the pixel unit includes: a pixel circuit and a light-emitting device. The light-emitting device in the present disclosure refers to a current-driven light-emitting element including an organic light-emitting diode (OLED), a light-emitting diode (LED), and the like. The embodiment of the present disclosure will be illustratively described by taking the OLED being used as the light-emitting device as an example, and a first terminal and a second terminal of the light-emitting device respectively refer to an anode terminal and a cathode terminal.

Figure 4:
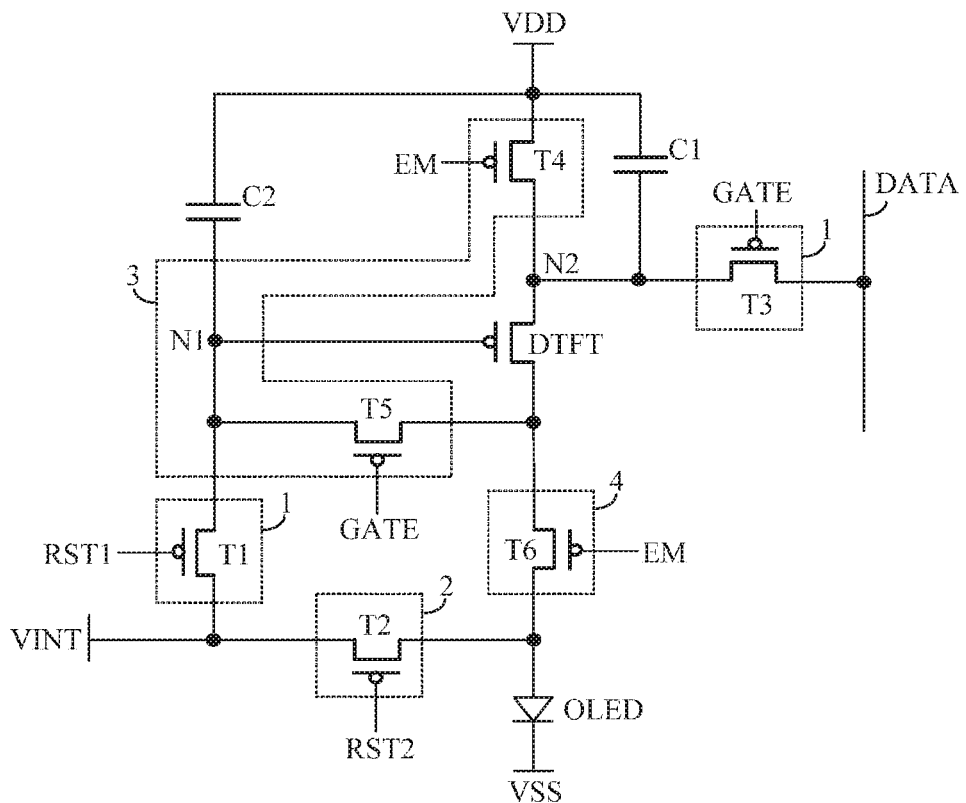
FIG. 4 is a schematic circuit diagram of a pixel unit according to an embodiment of the present disclosure.

FIG. 4 is a schematic circuit diagram of a pixel unit according to an embodiment of the present disclosure, as shown in FIG. 4, in some implementations, the pixel circuit includes: a first reset sub-circuit 1, a second reset sub-circuit 2, a data writing sub-circuit 3, a threshold compensation sub-circuit 4, and a driving transistor DTFT.

The first reset sub-circuit 1 is coupled to a first power supply terminal, a control electrode of the driving transistor DTFT, and a corresponding first reset signal line RST1, and the first reset sub-circuit 1 is configured to write a first voltage provided by the first power supply terminal to the control electrode of the driving transistor DTFT in response to control of the first reset signal line RST1.

The second reset sub-circuit 2 is coupled to the first power supply terminal, a first terminal of the light-emitting device OLED, and a corresponding second reset signal line RST2, and the second reset sub-circuit 2 is configured to write the first voltage to the first terminal of the light-emitting device OLED in response to control of the second reset signal line RST2.

The data writing sub-circuit 3 is coupled to a first electrode of the driving transistor DTFT, a corresponding data line DATA, and a corresponding gate line GATE, and the data writing sub-circuit 3 is configured to write a data voltage provided by the data line DATA to the first electrode of the driving transistor DTFT in response to control of the gate line GATE.

The threshold compensation sub-circuit 4 is coupled to a second power supply terminal, the control electrode of the driving transistor DTFT, the first electrode of the driving transistor DTFT, a second electrode of the driving transistor DTFT, and the corresponding gate line GATE, and the threshold compensation sub-circuit 4 is configured to write a data compensation voltage, which is equal to a sum of the data voltage and a threshold voltage of the driving transistor DTFT, to the control electrode of the driving transistor DTFT in response to control of the gate line GATE.

The second electrode of the driving transistor DTFT is coupled to the first terminal of the light-emitting device OLED, and the driving transistor DTFT is configured to output a corresponding driving current in response to control of the data compensation voltage; a second terminal of the light-emitting device OLED is coupled to a third power supply terminal.

With continued reference to FIG. 4, in some implementations, the first reset sub-circuit 1 includes a first transistor T1, the second reset sub-circuit 2 includes a second transistor T2, the data writing sub-circuit 3 includes a third transistor T3, and the threshold compensation sub-circuit 4 includes a fourth transistor T4 and a fifth transistor T5.

A control electrode of the first transistor T1 is coupled to the first reset signal line RST1, a first electrode of the first transistor T1 is coupled to the first power supply terminal, and a second electrode of the first transistor T1 is coupled to the control electrode of the driving transistor DTFT.

A control electrode of the second transistor T2 is coupled to the second reset signal line RST2, a first electrode of the second transistor T2 is coupled to the first power supply terminal, and a second electrode of the second transistor T2 is coupled to the first terminal of the light-emitting device.

A control electrode of the third transistor T3 is coupled to the gate line GATE, a first electrode of the third transistor T3 is coupled to the data line, and a second electrode of the third transistor T3 is coupled to the first electrode of the driving transistor DTFT.

A control electrode of the fourth transistor T4 is coupled to the light-emitting control signal line EM, a first electrode of the fourth transistor T4 is coupled to the second power supply terminal, and a second electrode of the fourth transistor T4 is coupled to the first electrode of the driving transistor DTFT.

A control electrode of the fifth transistor T5 is coupled to the gate line GATE, a first electrode of the fifth transistor T5 is coupled to the control electrode of the driving transistor DTFT, and a second electrode of the fifth transistor T5 is coupled to the second electrode of the driving transistor DTFT.

In some implementations, the pixel circuit further includes: a sixth transistor T6, and the second electrode of the driving transistor DTFT is coupled to the first terminal of the light-emitting device through the sixth transistor T6; specifically, a control electrode of the sixth transistor T6 is coupled to the light-emitting control signal line EM, a first electrode of the sixth transistor T6 is coupled to the second electrode of the driving transistor DTFT, and a second electrode of the sixth transistor T6 is coupled to the first terminal of the light-emitting device.

An operation of the pixel circuit shown in FIG. 4 will be described in detail below with reference to the accompanying drawings. It is assumed that the first power supply terminal provides the first voltage as a reset voltage VINT, the second power supply terminal provides a second voltage as an operating voltage VDD, and the third power supply terminal provides a third voltage as an operating voltage VSS.

Figure 5:
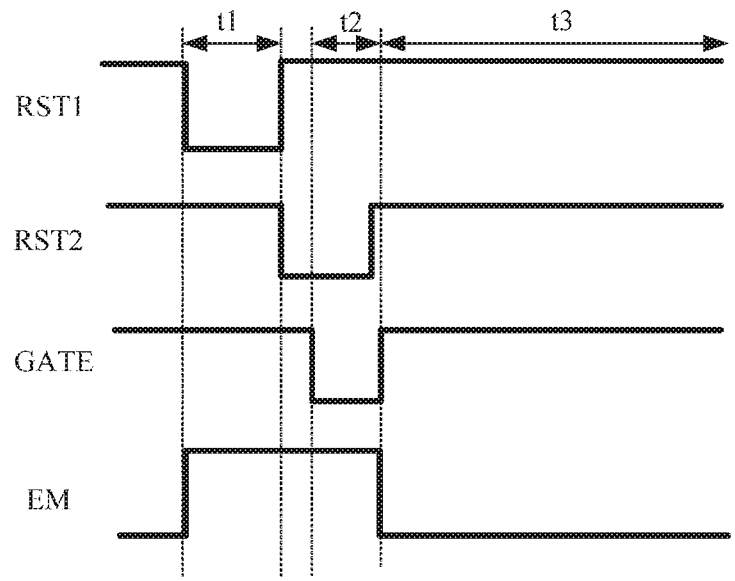
FIG. 5 is a timing diagram of an operation of the pixel circuit shown in FIG. 4.

FIG. 5 is a timing diagram of an operation of the pixel circuit shown in FIG. 4, and as shown in FIG. 5, the operation of the pixel circuit includes: a reset phase t1, a data writing and compensating phase t2, and a light-emitting phase t3.

During the reset phase t1, the first reset signal line RST1 provides a low-level signal, the second reset signal line RST2 provides a high-level signal, the gate line GATE provides a high-level signal, and the light-emitting control signal line EM provides a high-level signal.

Since the first reset signal line RST1 provides the low-level signal, the first transistor T1 is turned on, and the reset voltage VINT is written to the node N1 through the first transistor T1, so that a reset process on the control electrode of the driving transistor DTFT is performed. Meanwhile, the second to sixth transistors T2 to T6 are all turned off due to high-level signals provided by the second reset signal line RST2, the gate line GATE, and the light-emitting control signal line EM.

During the data writing and compensating phase t2, the first reset signal line RST1 provides a high-level signal, the second reset signal line RST2 provides a low-level signal, the gate line GATE provides a low-level signal, and the light-emitting control signal line EM provides a high-level signal.

Since the first reset signal line RST1 provides the high-level signal, the first transistor T1 is turned off. Meanwhile, since the gate line GATE provides the low-level signal, the third transistor T3 and the fifth transistor T5 are both turned on, the data voltage provided by the data line is written to the node N2 through the third transistor T3, at this time, the driving transistor DTFT is turned on, and the node N1 is charged through the fifth transistor T5, until a voltage at the node N1 is charged to Vdata+Vth, the driving transistor DTFT is turned off, and the charging is completed, where Vdata is the data voltage, and Vth is the threshold voltage of the driving transistor DTFT.

At this time, since the second reset signal line RST2 provides the low-level signal, the second transistor T2 is turned on, and the reset voltage VINT is written to the first terminal of the light-emitting device OLED through the second transistor T2 to perform a reset process on the first terminal of the light-emitting device OLED.

It should be noted that, in the process of charging the node N1 by the current output by the driving transistor DTFT, since the sixth transistor T6 is turned off, the light-emitting device OLED can be prevented from emitting light by mistake, so as to improve the display effect. Certainly, in some implementations, the sixth transistor T6 may not be required.

During the light-emitting phase t3, the first reset signal line RST1 provides a high-level signal, the second reset signal line RST2 provides a high-level signal, the gate line GATE provides a high-level signal, and the light-emitting control signal line EM provides a low-level signal.

Since the light-emitting control signal line EM provides the low-level signal, the fourth transistor T4 and the sixth transistor T6 are turned on, and the driving transistor DTFT outputs a driving current I according to the voltage at the node N1 to drive the light-emitting device OLED to emit light, where it can be obtained according to a formula of saturated driving current of the driving transistor DTFT that $$\begin{aligned} I &= K*(Vgs-Vth)^2 \\ &= K*(Vdata+Vth-VDD-Vth)^2 \\ &= K*(Vdata-VDD)^2 \end{aligned},$$

where K is a constant (a magnitude thereof is related to electrical characteristics of the driving transistor DTFT), and Vgs is a gate-source voltage of the driving transistor DTFT.

As can be seen from the above formula, the driving current of the driving transistor DTFT is only related to the data voltage Vdata and the operating voltage VDD, but is not related to the threshold voltage Vth of the driving transistor DTFT, and thus the driving current flowing through the light-emitting device OLED is prevented from being affected by non-uniformity and drift of the threshold voltage, and uniformity of the driving current flowing through the light-emitting device OLED is effectively improved.

It should be noted that, in the embodiment of the present disclosure, the time for performing the reset process on the first terminal of the light-emitting device OLED through the second transistor T2 (the second transistor T2 is turned on) is not limited to the data writing and compensating phase t2; specifically, the time when the second transistor T2 switches from being turned off to being turned on may be before a beginning of the data writing and compensating phase t2, or at the beginning of the data writing and compensating phase t2, or after the beginning of the data writing and compensating phase t2; the time when the second transistor T2 switches from being turned on to being turned off may be before a terminal of the data writing and compensating phase t2, or at the terminal of the data writing and compensating phase t2, or after the terminal of the data writing and compensating phase t2 and before the light-emitting phase t3. The time period during which the second transistor T2 is being turned on may be designed by those skilled in the art as actual requirements, and in the present disclosure, since the first reset signal line RST1 and the second reset signal line RST2 correspond to a single driving circuit, it is only necessary to ensure that, in one driving cycle, the time period during which the second transistor T2 is being turned on is equal to a time period during which the first transistor T1 is being turned on.

In some implementations, in order to ensure that the voltage at the node N2 is always maintained at Vdata during the data writing and compensating phase t2, a first capacitor C1 may be further provided in the pixel circuit, where a first terminal of the first capacitor C1 is coupled to the second power supply terminal, and a second terminal of the first capacitor C1 is coupled to the first electrode of the driving transistor.

In some implementations, in order to ensure that the voltage at the node N1 is always maintained at Vdata+Vth during the light-emitting phase, a second capacitor C2 may be further provided in the pixel circuit, a first terminal of the second capacitor C2 is coupled to the second power supply terminal, and a second terminal of the second capacitor C2 is coupled to the control electrode of the driving transistor.

It should be noted that the pixel circuit in the present embodiment adopts the configuration shown in FIG. 2, which is only an alternative solution of the present disclosure, and does not limit the technical solution of the present disclosure.

Figure 6:
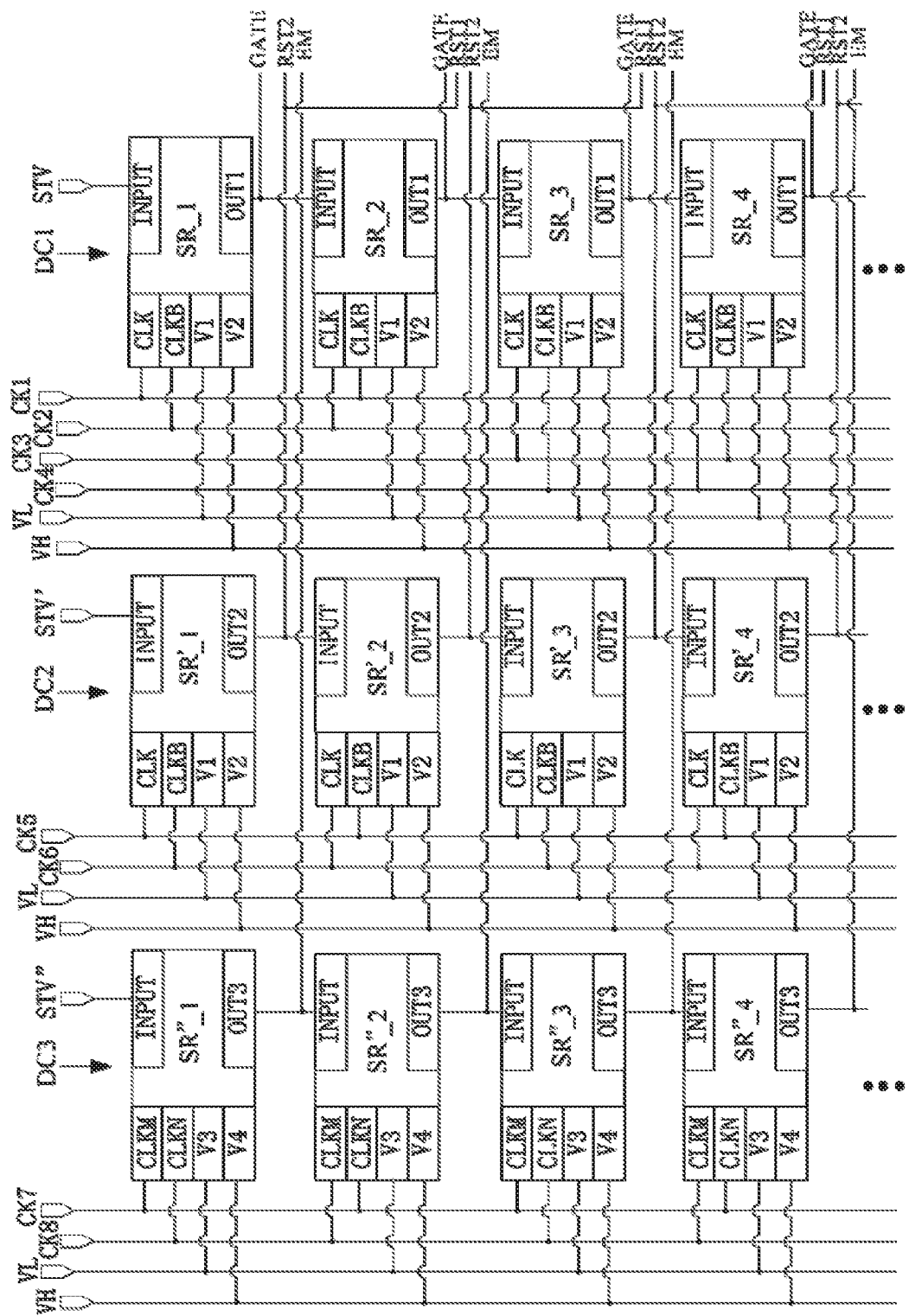
FIG. 6 is a schematic structural diagram of a driving module according to an embodiment of the present disclosure.

FIG. 6 is a schematic structural diagram of a driving module according to an embodiment of the present disclosure, and as shown in FIG. 6, in some implementations, in the driving module, the gate driving circuit DC1, the reset driving circuit DC2, and the light-emitting control driving circuit DC3 are arranged along the second direction.

It should be noted that FIG. 6 only exemplifies a case where, in the driving module, the reset driving circuit DC2 is located at a side of the light-emitting control driving circuit DC3 away from the display area A, and the light-emitting control driving circuit DC3 is located at a side of the reset driving circuit DC2 away from the display area A. In the embodiment of the present disclosure, in a case where it is satisfied that the gate driving circuit DC1, the reset driving circuit DC2, and the light-emitting control driving circuit DC3 are arranged in the second direction, the positional relationship among the gate driving circuit DC1, the reset driving circuit DC2, and the light-emitting control driving circuit DC3 may be appropriately adjusted.

In some implementations, the gate driving circuit DC1 includes N first shift registers SR_1/SR_2....../SR_N coupled in cascade, and the reset driving circuit DC2 includes N second shift registers S'_1/SR'_2....../SR'_N coupled in cascade. The signal output terminal of the first shift register SR_j at the j$^{th}$ stage is the j$^{th}$ first signal output terminal OUT1; the signal output terminal of the second shift register SR'_j at the j$^{th}$ stage is the j$^{th}$ second signal output terminal OUT2, j is an integer, and j is greater than or equal to 1 and less than or equal to N.

It should be noted that, the specific manner for making the shift registers be coupled in cascade in the driving circuit is conventional in the art, and will not be described in detail here.

In some implementations, the N pixel unit groups are arranged along the first direction, the N first shift registers SR_1/SR_2....../SR_N in the gate driving circuit DC1 are arranged along the first direction, and the N first shift registers SR'_1/SR'_2....../SR'_N in the reset driving circuit DC2 are arranged along the first direction.

Figure 7:
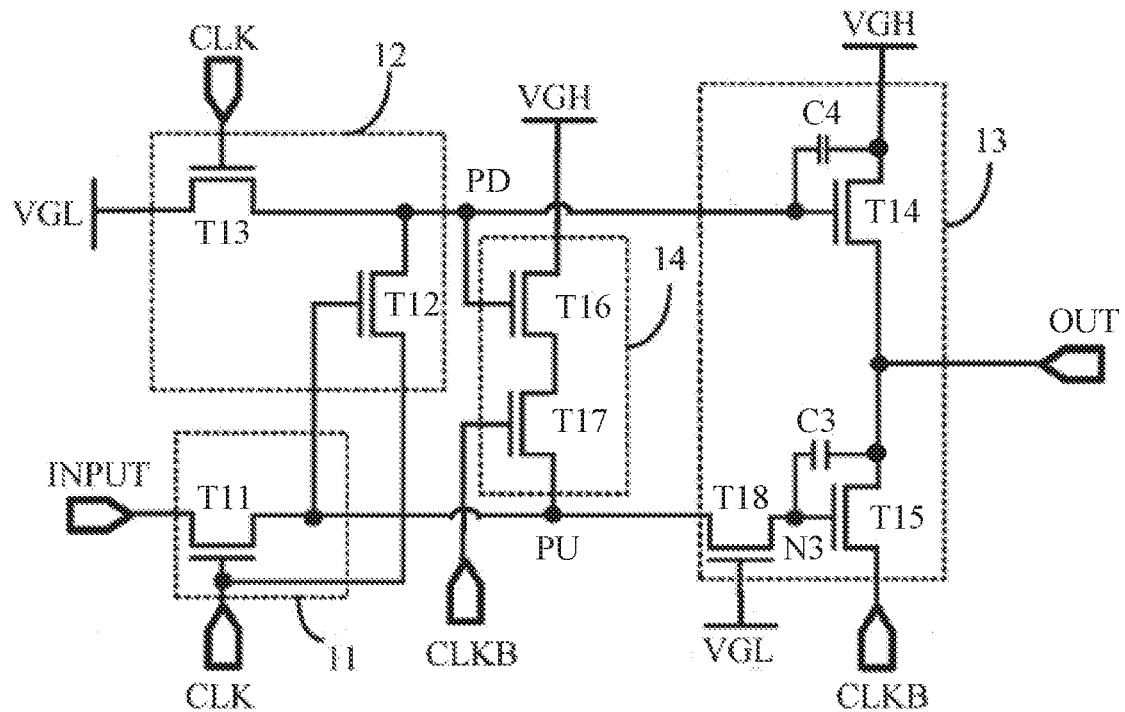
FIG. 7 is a schematic circuit diagram of a shift register in a gate driving circuit and a reset driving circuit according to an embodiment of the present disclosure.

FIG. 7 is a schematic circuit diagram of a shift register in the gate driving circuit DC1 and the reset driving circuit DC2 according to an embodiment of the present disclosure, as shown in FIG. 7, the shift register includes: a first input sub-circuit 11, a first pull-down control sub-circuit 12, a first output sub-circuit 13 and a first pull-down sub-circuit 14.

The first input sub-circuit 11 is coupled to an input signal terminal INPUT, a pull-up node PU and a first clock signal terminal CLK, and the first input sub-circuit 11 is configured to write an input signal provided by the input signal terminal INPUT to the pull-up node PU in response to control of the first clock signal terminal CLK.

The first pull-down control sub-circuit 12 is coupled to a first operating voltage terminal V1, the pull-up node PU, a pull-down node PD, and the first clock signal terminal CLK, and the first pull-down control sub-circuit 12 is configured to write a first operating voltage provided by the first operating voltage terminal V1 to the pull-down node PD in response to control of the first clock signal terminal CLK, and write a first clock signal provided by the first clock signal terminal CLK to the pull-down node PD in response to control of the voltage at the pull-up node PU.

The first output sub-circuit 13 is coupled to a second operating voltage terminal V2, the pull-up node PU, the pull-down node PD, a signal output terminal OUT, and a second clock signal terminal CLKB, and the first output sub-circuit 13 is configured to write a second clock signal provided by the second clock signal terminal CLKB to the signal output terminal OUT in response to control of the voltage at the pull-up node PU, and write a second operating voltage provided by the second operating voltage terminal V2 to the signal output terminal OUT in response to control of the pull-down node PD.

The first pull-down sub-circuit 14 is coupled to the second operating voltage terminal V2, the pull-up node PU, the pull-down node PD, and the second clock signal terminal CLKB, and the first pull-down sub-circuit 14 is configured to write the second operating voltage to the pull-up node PU in response to the control of the voltage at the pull-down node PD and the second clock signal terminal CLKB.

In some implementations, the first input sub-circuit 11 includes an eleventh transistor T11, the first pull-down control sub-circuit 12 includes twelfth and thirteenth transistors T12 and T13, the first output sub-circuit 13 includes fourteenth and fifteenth transistors T14 and T15, and the first pull-down sub-circuit 14 includes sixteenth and seventeenth transistors T16 and T17.

A control electrode of the eleventh transistor T11 is coupled to the first clock signal terminal CLK, a first electrode of the eleventh transistor T11 is coupled to the input signal terminal INPUT, and a second electrode of the eleventh transistor T11 is coupled to the pull-up node PU.

A control electrode of the twelfth transistor T12 is coupled to the pull-up node PU, a first electrode of the twelfth transistor T12 is coupled to the first clock signal terminal CLK, and a second electrode of the twelfth transistor T12 is coupled to the pull-down node PD.

A control electrode of the thirteenth transistor T13 is coupled to the first clock signal terminal CLK, a first electrode of the thirteenth transistor T13 is coupled to the first operating voltage terminal V1, and a second electrode of the thirteenth transistor T13 is coupled to the pull-down node PD.

A control electrode of the fourteenth transistor T14 is coupled to the pull-down node PD, a first electrode of the fourteenth transistor T14 is coupled to the second operating voltage terminal V2, and a second electrode of the fourteenth transistor T14 is coupled to the signal output terminal OUT.

A control electrode of the fifteenth transistor T15 is coupled to the pull-up node PU, a first electrode of the fifteenth transistor T15 is coupled to the second clock signal terminal CLKB, and a second electrode of the fifteenth transistor T15 is coupled to the signal output terminal OUT.

A control electrode of the sixteenth transistor T16 is coupled to the pull-down node PD, a first electrode of the sixteenth transistor T16 is coupled to the second operating voltage terminal V2, and a second electrode of the sixteenth transistor T16 is coupled to a first electrode of the seventeenth transistor T17.

A control electrode of the seventeenth transistor T17 is coupled to the second clock signal terminal CLKB, and a second electrode of the seventeenth transistor T17 is coupled to the pull-up node PU.

In some implementations, the first output sub-circuit further includes an eighteenth transistor T18, a third capacitor C3, and a fourth capacitor C4, and the control electrode of the fifteenth transistor T15 is coupled to the pull-up node PU through an eighteenth transistor T18.

A control electrode of the eighteenth transistor T18 is coupled to the first operating voltage terminal V1, a first electrode of the eighteenth transistor T18 is coupled to the pull-up node PU, and a second electrode of the eighteenth transistor T18 is coupled to the control electrode of the fifteenth transistor T15.

A first terminal of the third capacitor C3 is coupled to the control electrode of the fifteenth transistor T15, and a second terminal of the third capacitor C3 is coupled to the signal output terminal OUT.

A first terminal of the fourth capacitor C4 is coupled to the pull-down node PD, and a second terminal of the fourth capacitor C4 is coupled to the first electrode of the fourteenth transistor T14.

An operation of the shift register shown in FIG. 7 will be described below in detail with reference to the accompanying drawings. It is assumed that the first operating voltage terminal V1 provides a low-level operating voltage VGL and the second operating voltage terminal V2 provides a high-level operating voltage VGH.

Figure 8:
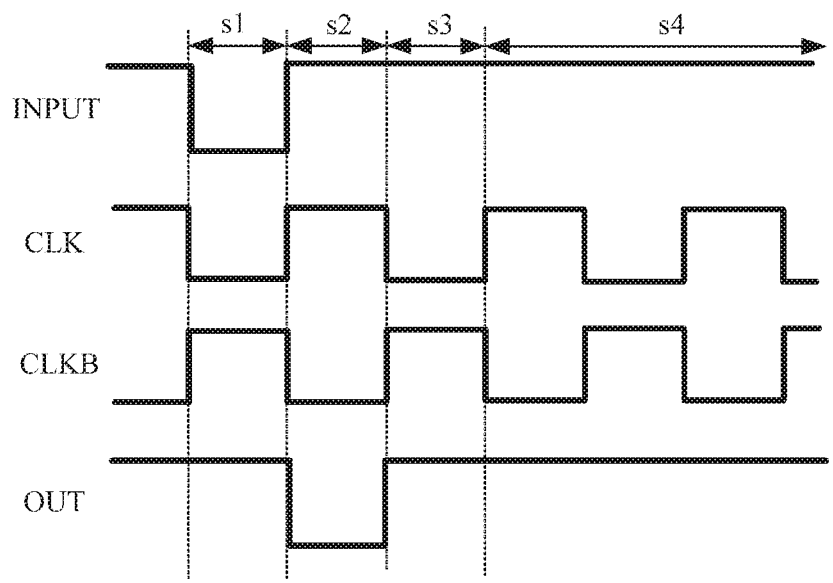
FIG. 8 is a timing diagram of an operation of the shift register shown in FIG. 7.

FIG. 8 is a timing diagram of an operation of the shift register shown in FIG. 7, and as shown in FIG. 8, the operation of the shift register includes: a charging phase $s1$, an output phase $s2$, a reset phase $s3$ and a holding phase $s4$.

During the charging phase $s1$, the input signal terminal INPUT provides a low-level signal, the first clock signal terminal CLK provides a low-level signal, and the second clock signal terminal CLKB provides a high-level signal. At this time, the eleventh transistor T11, the twelfth transistor T12, the thirteenth transistor T13, the fourteenth transistor T14, the fifteenth transistor T15, the sixteenth transistor T16, and the eighteenth transistor T18 are all turned on, and the seventeenth transistor T17 is turned off; the pull-up node PU and the pull-down node PD are both at a low level. The high-level operating voltage VGH is written to the signal output terminal OUT through the fourteenth transistor T14, and the high-level signal provided by the second clock signal terminal CLKB is written to the signal output terminal OUT through the fifteenth transistor T15, and thus the signal output terminal OUT outputs a high-level signal.

During the output phase $s2$, the input signal terminal INPUT provides a high-level signal, the first clock signal terminal CLK provides a high-level signal, and the second clock signal terminal CLKB provides a low-level signal. At this time, the twelfth transistor T12, the fifteenth transistor T15, and the seventeenth transistor T17 are all turned on, and the eleventh transistor T11, the thirteenth transistor T13, the fourteenth transistor T14, the sixteenth transistor T16, and the eighteenth transistor are all turned off. The pull-up node PU is at a low level, and the pull-down node PD is at a high level; the low-level signal provided by the second clock signal terminal CLKB is written to the signal output terminal OUT through the fifteenth transistor T15, and thus the signal output terminal OUT outputs a low-level signal.

It should be noted that, since the signal provided by the clock signal terminal changes from a high level to a low level, the voltage at the node N3 is pulled down to a lower level under a bootstrap action of the third capacitor C3; at this time, for the eighteenth transistor T18, since the voltage VGL at the control electrode thereof is greater than the voltage at the node N3 (i.e., the gate voltage VGL at this time is at a high level compared to the source voltage), the eighteenth transistor T18 is turned off. Since the eighteenth transistor T18 is turned off, it is possible to prevent a too low voltage at the node N3 from being written to the pull-up node PU, and thus the eleventh transistor T11 and the twelfth transistor T12 are prevented from being applied with a too high voltage, thereby improving service lives of the eleventh transistor T11 and the twelfth transistor T12.

During the reset phase $s3$, the input signal terminal INPUT provides a high-level signal, the first clock signal terminal CLK provides a low-level signal, and the second clock signal terminal CLKB provides a high-level signal. At this time, the eleventh transistor T11, the thirteenth transistor T13, the fourteenth transistor T14, the sixteenth transistor T16, the seventeenth transistor T17, and the eighteenth transistor T18 are all turned on, and the twelfth transistor T12 and the fifteenth transistor T15 are all turned off. The pull-up node PU is at a high level, and the pull-down node PD is at a low level; the high-level operating voltage VGH is written to the signal output terminal OUT through the fourteenth transistor T14.

During the holding phase $s4$, the input signal terminal INPUT provides a high-level signal, the first clock signal terminal CLK provides a clock signal switching between high/low levels, and the second clock signal terminal CLKB provides a clock signal switching between high/low levels. The pull-up node PU is always at a high level, the pull-down node PD is always at a low level, the fourteenth transistor T14 is kept to be turned on, the fifteenth transistor T15 is kept to be turned off, and the signal output terminal OUT keeps outputting a high-level signal.

In some implementations, the signal output terminal OUT of the shift register at the $i^{th}$ stage is coupled to the input signal terminal INPUT at the $(i+1)^{ia}$ stage to make the two shift registers be coupled in cascade; at this time, the input signal terminal INPUT of the shift register at the first stage is coupled to a frame start signal terminal. Specifically, the input signal terminal INPUT of the first shift register at the first stage in the gate driving circuit is coupled to a first frame start signal terminal STV, the input signal terminal INPUT of the second shift register at the first stage in the reset driving circuit is coupled to a second frame start signal terminal STV', and the gate driving circuit DC1 and the reset driving circuit DC2 can be controlled to operate by the first frame start signal terminal STV and the second frame start signal terminal STV', respectively.

In addition, the first reset signal line configured for the first pixel unit group in the display area is coupled to the second frame start signal terminal STV'.

Figure 9:
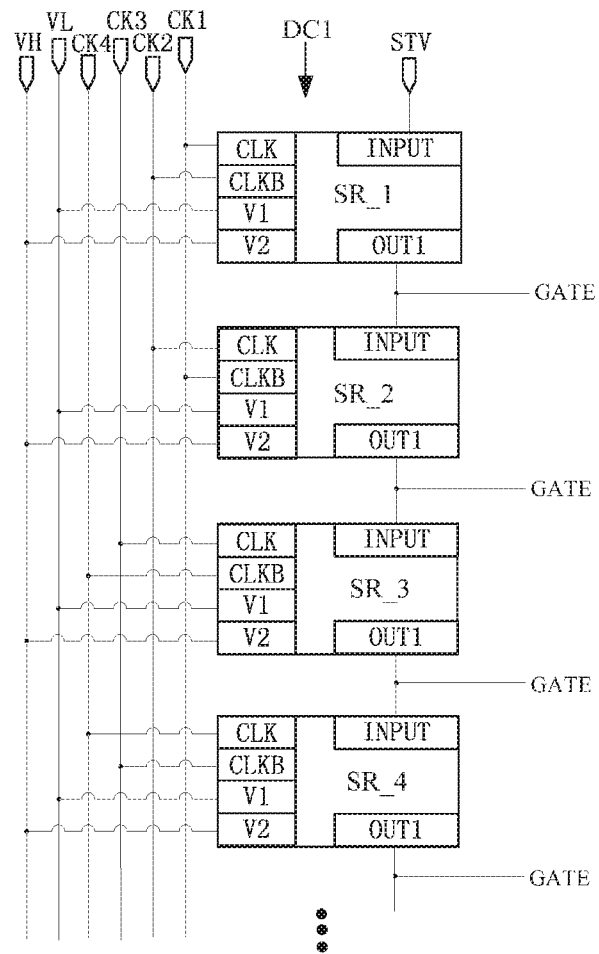
FIG. 9 is a schematic structural diagram of a gate driving circuit and signal lines thereof according to an embodiment of the present disclosure.
Figure 10:
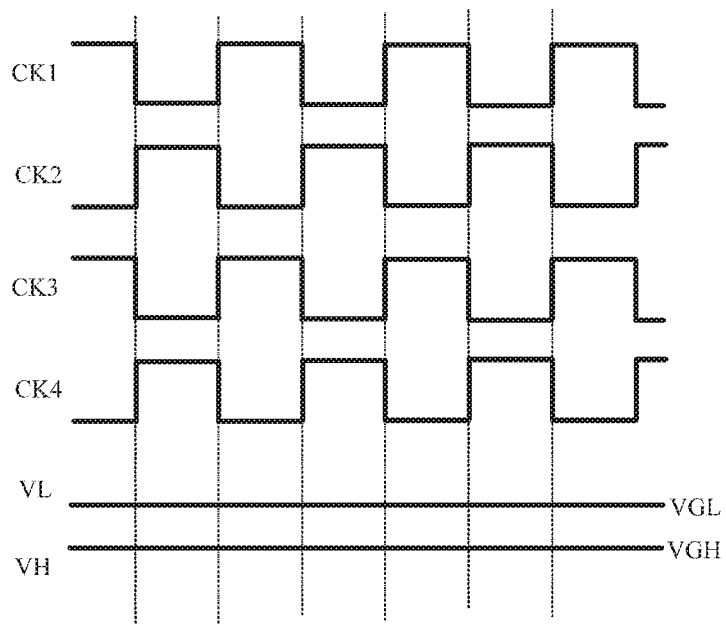
FIG. 10 is a waveform diagram of signals carried by six signal lines of FIG. 9.

FIG. 9 is a schematic structural diagram of the gate driving circuit DC1 and signal lines thereof according to an embodiment of the present disclosure, FIG. 10 is a waveform diagram of signals carried by six signal lines of FIG. 9, and as shown in FIG. 9 and FIG. 10, the operating signal line group corresponding to the gate driving circuit DC1 includes four clock signal lines and two operating voltage signal lines, i.e., a first clock signal line CK1, a second clock signal line CK2, a third clock signal line CK3, a fourth clock signal line CK4, a high-level operating voltage signal line VH, and a low-level operating voltage signal line VL.

The first clock signal terminal CLK of the first shift register at the $(4k-3)^{th}$ stage is coupled to the first clock signal line CK1, and the second clock signal terminal CLKB of the first shift register at the $(4k-3)^{th}$ stage is coupled to the second clock signal line CK2.

The first clock signal terminal CLK of the first shift register at the $(4k-2)^{th}$ stage is coupled to the second clock signal line CK2, and the second clock signal terminal CLKB of the first shift register at the (4k-2)$^{th}$ stage is coupled to the first clock signal line CK1.

The first clock signal terminal CLK of the first shift register at the (4k-1)$^{th}$ stage is coupled to the third clock signal line CK3, and the second clock signal terminal CLKB of the first shift register at the (4k-1)$^{th}$ stage is coupled to the fourth clock signal line CK4.

The first clock signal terminal CLK of the first shift register at the 4k$^{th}$ stage is coupled to the fourth clock signal line CK4, and the second clock signal terminal CLKB of the first shift register at the 4k$^{th}$ stage is coupled to the third clock signal line CK3, where k is an integer and is greater than or equal to 1 and less than or equal to N/4.

The first operating voltage terminal V1 of each stage of the shift register is coupled to the low-level operating voltage signal line VL, and the second operating voltage terminal V2 of each stage of the shift register is coupled to the high-level operating voltage signal line VH.

A time period during which the clock signal provided by the first clock signal line CK1 is at an active level is staggered from a time period during which the clock signal provided by the second clock signal line CK2 is at an active level; the first clock signal line CK1 and the third clock signal line CK3 supply clock signals the same as each other, and the second clock signal line CK2 and the fourth clock signal line CK4 supply clock signal the same as each other. The low-level operating voltage signal line VL provides a low-level operating voltage VGL, and the high-level operating voltage signal line VH provides a high-level operating voltage VGH.

Considering that the stability of output of the gate driving circuit DC1 has a great influence on the driving process of the pixel unit, it is very important to ensure the stability of output of the gate driving circuit DC1. In the present embodiment, by configuring four clock signal lines, and each clock signal line is coupled to only N/2 shift registers, a load on each clock signal line can be effectively reduced, and a stable output of the gate driving circuit DC1 can be ensured.

Figure 11:
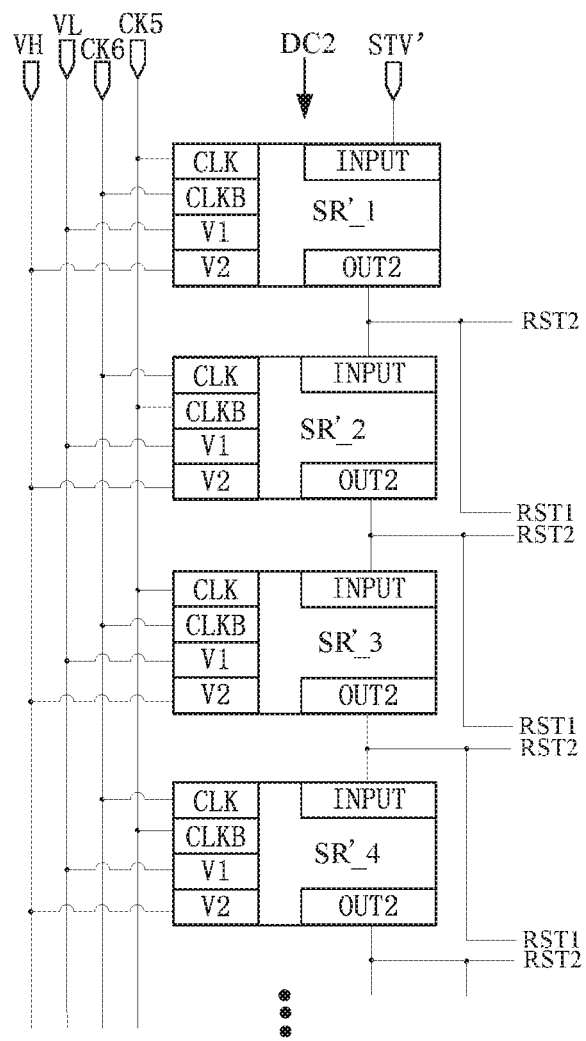
FIG. 11 is a schematic structural diagram of a reset driving circuit and signal lines thereof according to an embodiment of the present disclosure.
Figure 12:
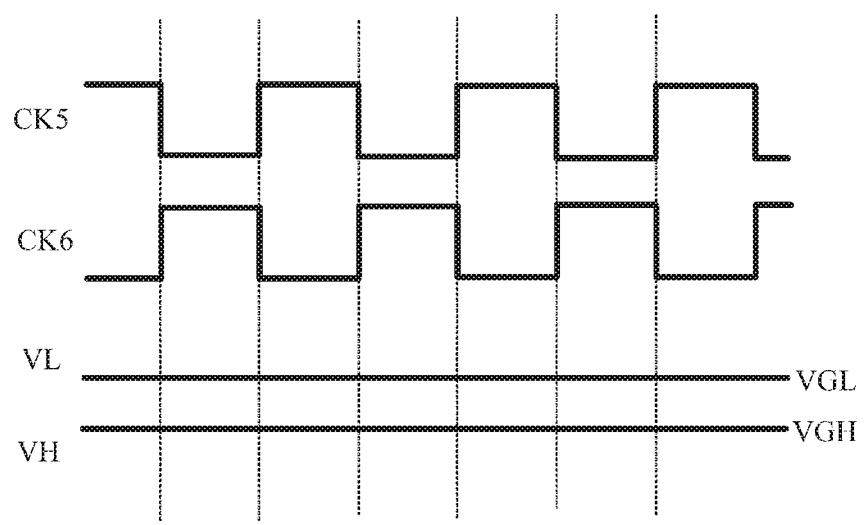
FIG. 12 is a waveform diagram of signals carried by four signal lines of FIG. 11.

FIG. 11 is a schematic structural diagram of the reset driving circuit DC2 and signal lines thereof according to an embodiment of the present disclosure, FIG. 12 is a waveform diagram of signals carried by four signal lines of FIG. 11, and as shown in FIG. 11 and FIG. 12, the operating signal line group corresponding to the reset driving circuit DC2 includes two clock signal lines and two operating voltage signal lines, i.e., a fifth clock signal line CK5, a sixth clock signal line CK6, a high-level operating voltage signal line VH, and a low-level operating voltage signal line VL.

The first clock signal terminal CLK of the second shift register at the (2m-1)$^{th}$ stage is coupled to the fifth clock signal line CK5, and the second clock signal terminal CLKB of the second shift register at the /2m-1)$^{th}$ stage is coupled to the sixth clock signal line CK 6.

The first clock signal terminal CLK of the second shift register at the 2m$^{th}$ stage is coupled to the sixth clock signal line CK6, and the second clock signal terminal CLKB of the second shift register at the 2m$^{th}$ stage is coupled to the fifth clock signal line CK5, where m is an integer and is greater than or equal to 1 and less than or equal to N/2.

The first operating voltage terminal V1 of each stage of the shift register is coupled to the low-level operating voltage signal line VL, and the second operating voltage terminal V2 of each stage of the shift register is coupled to the high-level operating voltage signal line VH.

A time period during which the clock signal provided by the fifth clock signal line CK5 is at an active level is staggered from a time period during which the clock signal provided by the sixth clock signal line CK6 is at an active level, the low-level operating voltage signal line VL provides the low-level operating voltage VGL, and the high-level operating voltage signal line VH provides the high-level operating voltage VGH.

Considering that the stability of output of the reset driving circuit DC2 has a relatively small influence on the driving process of the pixel unit, there is a relatively low requirement on the stability of output of the reset driving circuit DC2. In the present embodiment, by configuring two clock signal lines, the number of signal lines is reduced while satisfying the stability of output of the reset driving circuit DC2, which is beneficial to an implementation of a narrow bezel.

In some implementations, when the driving module includes the light-emitting control driving circuit DC3, the light-emitting control driving circuit DC3 includes N third shift registers SR″_1/SR″2....../SR″_N coupled in cascade, and the signal output terminal of the third shift register SR″_j at the j$^{th}$ stage is the j$^{th}$ third signal output terminal OUT3.

In some implementations, the N pixel unit groups are arranged in the first direction, and the N third shift registers SR″_1/SR″_2....../SR″_N in the light-emitting control driving circuit DC3 are arranged in the first direction.

Figure 13:
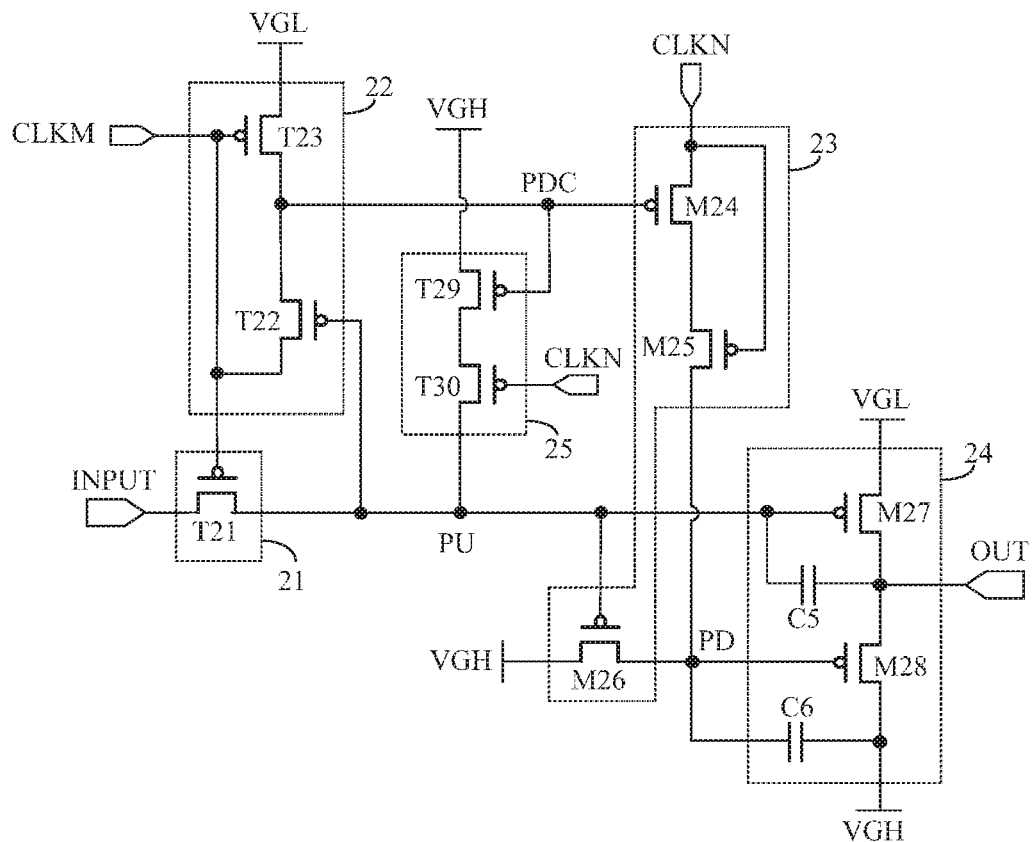
FIG. 13 is a schematic circuit diagram of a third shift register according to the embodiment of the present disclosure.

FIG. 13 is a schematic circuit diagram of a third shift register according to an embodiment of the present disclosure, and as shown in FIG. 13, the shift register includes: a second input sub-circuit 21, a voltage control sub-circuit 22, a second pull-down control sub-circuit 23, a second output sub-circuit 24 and a second pull-down sub-circuit 25.

The second input sub-circuit 21 is coupled to the input signal terminal INPUT, the pull-up node PU and the third clock signal terminal CLKM, and the second input sub-circuit 21 is configured to write an input signal provided by the input signal terminal INPUT to the pull-up node PU in response to control of the third clock signal terminal CLKM.

The voltage control sub-circuit 22 is coupled to the pull-up node PU, a pull-down control node PDC, and the third clock signal terminal CLKM, and the voltage control sub-circuit 22 is configured to write a third clock signal provided by the third clock signal terminal CLKM to the pull-down control node PDC in response to control of a voltage at the pull-up node PU, and write a third operating voltage provided by the third operating voltage terminal V3 to the pull-down control node PDC in response to control of the third clock signal terminal CLKM.

The second pull-down control sub-circuit 23 is coupled to the fourth operating voltage terminal V4, the pull-up node PU, the pull-down node PD, the pull-down control node PDC, and a fourth clock signal terminal CLKN, and the second pull-down control sub-circuit 23 is configured to write a fourth clock signal provided by the fourth clock signal terminal CLKN to the pull-down node PD in response to control of voltage at the pull-down control node PDC and the fourth clock signal terminal CLKN, and write a fourth operating voltage provided by the fourth operating voltage terminal V4 to the pull-down node PD in response to control of the voltage at the pull-up node PU.

The second output sub-circuit 24 is coupled to the third operating voltage terminal V3, the fourth operating voltage terminal V4, the pull-up node PU, the pull-down node PD, and the signal output terminal, and the second output sub-circuit 24 is configured to write the third operating voltage to the signal output terminal in response to control of the voltage at the pull-up node PU, and write the fourth operating voltage to the signal output terminal in response to control of the pull-down node PD.

The second pull-down sub-circuit 25 is coupled to the fourth operating voltage terminal V4, the pull-up node PU, the pull-down control node PDC, and the fourth clock signal terminal CLKN, and the second pull-down sub-circuit 25 is configured to write the fourth operating voltage to the pull-up node PU in response to control of the voltage at the pull-down control node PDC and the second clock signal terminal CLKB.

In some implementations, the second input sub-circuit 21 includes a twenty-first transistor T21, the voltage control sub-circuit 22 includes a twenty-second transistor T22 and a twenty-third transistor T23, the second pull-down control sub-circuit 23 includes a twenty-fourth transistor T24, a twenty-fifth transistor T25 and a twenty-sixth transistor T26, the second output sub-circuit 24 includes a twenty-seventh transistor T27, a twenty-eighth transistor T28, a fifth capacitor C5 and a sixth capacitor C6, and the second pull-down sub-circuit 25 includes a twenty-ninth transistor T29 and a thirtieth transistor T30.

A control electrode of the twenty-first transistor T21 is coupled to the third clock signal terminal CLKM, a first electrode of the twenty-first transistor T21 is coupled to the input signal terminal INPUT, and a second electrode of the twenty-first transistor T21 is coupled to the pull-up node PU.

A control electrode of the twenty-second transistor T22 is coupled to the pull-up node PU, a first electrode of the twenty-second transistor T22 is coupled to the third clock signal terminal CLKM, and a second electrode of the twenty-second transistor T22 is coupled to the pull-down control node PDC.

A control electrode of the twenty-third transistor T23 is coupled to the third clock signal terminal CLKM, a first electrode of the twenty-third transistor T23 is coupled to the third operating voltage terminal V3, and a second electrode of the twenty-third transistor T23 is coupled to the pull-down control node PDC.

A control electrode of the twenty-fourth transistor T24 is coupled to the pull-down control node PDC, a first electrode of the twenty-fourth transistor T24 is coupled to the fourth clock signal terminal CLKN, and a second electrode of the twenty-fourth transistor T24 is coupled to a first electrode of the twenty-fifth transistor T25.

A control electrode of the twenty-fifth transistor T25 is coupled to the fourth clock signal terminal CLKN, and a second electrode of the twenty-fifth transistor T25 is coupled to the pull-down node PD.

A control electrode of the twenty-sixth transistor T26 is coupled to the pull-up node PU, a first electrode of the twenty-sixth transistor T26 is coupled to the fourth operating voltage terminal V4, and a second electrode of the twenty-sixth transistor T26 is coupled to the pull-down node PD.

A control electrode of the twenty-seventh transistor T27 is coupled to the pull-up node PU, a first electrode of the twenty-seventh transistor T27 is coupled to the third operating voltage terminal V3, and a second electrode of the twenty-seventh transistor T27 is coupled to the signal output terminal.

A control electrode of the twenty-eighth transistor T28 is coupled to the pull-down node PD, a first electrode of the twenty-eighth transistor T28 is coupled to the fourth operating voltage terminal V4, and a second electrode of the twenty-eighth transistor T28 is coupled to the signal output terminal.

A control electrode of the twenty-ninth transistor T29 is coupled to the pull-down control node PDC, a first electrode of the twenty-ninth transistor T29 is coupled to the fourth operating voltage terminal V4, and a second electrode of the twenty-ninth transistor T29 is coupled to a first electrode of the thirty-third transistor T30.

A control electrode of the thirtieth transistor T30 is coupled to the fourth clock signal terminal CLKN, and a second electrode of the thirtieth transistor T30 is coupled to the pull-up node PU.

A first terminal of the fifth capacitor C5 is coupled to the control electrode of the twenty-seventh transistor T27, and a second terminal of the fifth capacitor C5 is coupled to the signal output terminal.

A first terminal of the sixth capacitor C6 is coupled to the pull-down node PD, and a second terminal of the sixth capacitor C6 is coupled to the fourth operating voltage terminal V4.

An operation of the shift register shown in FIG. 13 will be described below in detail with reference to the accompanying drawings. It is assumed that the third operating voltage terminal V3 provides a low-level operating voltage VGL and the fourth operating voltage terminal V4 provides a high-level operating voltage VGH.

Figure 14:
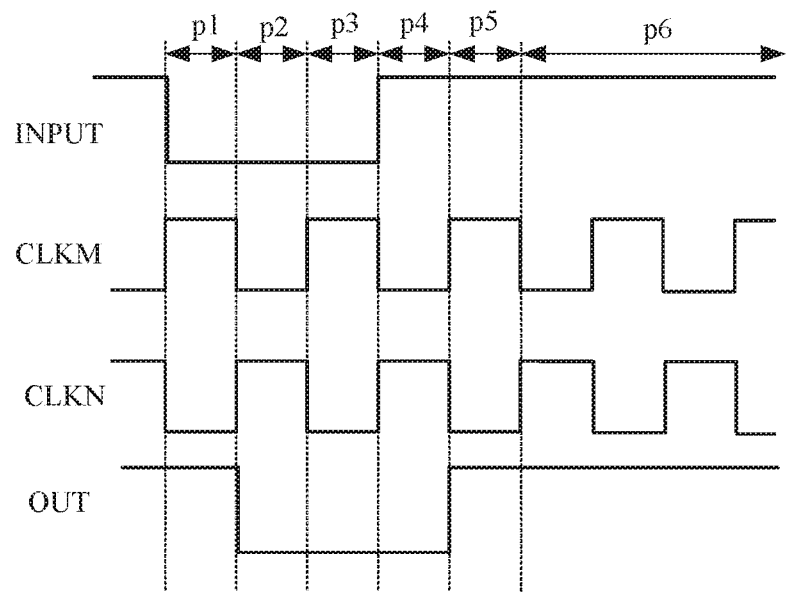
FIG. 14 is a timing diagram of an operation of the shift register shown in FIG. 13.

FIG. 14 is a timing diagram of an operation of the shift register shown in FIG. 13, and as shown in FIG. 14, the operation of the shift register includes: a charging phase p1, a first output phase p2, a second output phase p3, a third output phase p4, a reset phase p5 and a holding phase p6.

During the charging phase p1, the input signal terminal INPUT provides a low-level signal, the third clock signal terminal CLKM provides a high-level signal, and the fourth clock signal terminal CLKN provides a low-level signal. At this time, the twenty-fourth transistor T24, the twenty-fifth transistor T25, the twenty-eighth transistor T28, the twenty-ninth transistor T29, and the thirty-third transistor T30 are all turned on, and the twenty-first transistor T21, the twenty-second transistor T22, the twenty-third transistor T23, the twenty-sixth transistor T26 and the twenty-seventh transistor T27 are all turned off; the pull-down control node PDC and the pull-down node PD are at a low level, and the pull-up node PU is at a high level. The high-level operating voltage VGH is written to the signal output terminal OUT through the twenty-eighth transistor T28, and thus the signal output terminal OUT outputs a high-level signal.

During the first output phase p2, the input signal terminal INPUT provides a low-level signal, the third clock signal terminal CLKM provides a low-level signal, and the fourth clock signal terminal CLKN provides a high-level signal. At this time, the twenty-first transistor T21, the twenty-second transistor T22, the twenty-third transistor T23, the twenty-fourth transistor T24, the twenty-sixth transistor T26, the twenty-seventh transistor T27, and the twenty-ninth transistor T29 are all turned on, and the twenty-fifth transistor T25, the twenty-eighth transistor T28, and the thirty-third transistor T30 are all turned off. The pull-down control node PDC and the pull-up node PU are at a low level, and the pull-down node PD is at a high level. The low-level operating voltage VGL is written to the signal output terminal OUT through the twenty-seventh transistor T27, and thus the signal output terminal OUT outputs a low-level signal.

During the second output phase p3, the input signal terminal INPUT provides a low-level signal, the third clock signal terminal CLKM provides a high-level signal, and the fourth clock signal terminal CLKN provides a low-level signal. At this time, the twenty-second transistor T22, the twenty-fifth transistor T25, the twenty-sixth transistor T26, the twenty-seventh transistor T27 and the thirty-third transistor T30 are all turned on, and the twenty-first transistor T21, the twenty-third transistor T23, the twenty-fourth transistor T24, the twenty-eighth transistor T28 and the twenty-ninth transistor T29 are all turned off. The pull-up node PU is at a low level, and both the pull-down control node PDC and the pull-down node PD are at a high level. The low-level operating voltage VGL is written to the signal output terminal OUT through the twenty-seventh transistor T27, and thus the signal output terminal OUT outputs a low-level signal.

During the third output phase p4, the input signal terminal INPUT provides a high-level signal, the third clock signal terminal CLKM provides a low-level signal, and the fourth clock signal terminal CLKN provides a high-level signal. The twenty-first transistor T21, the twenty-third transistor T23, the twenty-fourth transistor T24 and the twenty-ninth transistor T29 are all turned on, and the twenty-second transistor T22, the twenty-fifth transistor T25, the twenty-sixth transistor T26, the twenty-seventh transistor T27, the twenty-eighth transistor T28 and the thirty-third transistor T30 are all turned off; the pull-down control node PDC is at a low level, and the pull-up node PU and the pull-down node PD are both at a high level. Since both the twenty-seventh transistor T27 and the twenty-eighth transistor T28 are turned off, the signal output terminal OUT is in a floating state, and the signal output terminal OUT maintains at the low level of the previous phase, that is, the signal output terminal OUT outputs a low-level signal.

During the reset phase p5, the input signal terminal INPUT provides a high-level signal, the third clock signal terminal CLKM provides a high-level signal, and the fourth clock signal terminal CLKN provides a low-level signal. At this time, the twenty-fourth transistor T24, the twenty-fifth transistor T25, the twenty-eighth transistor T28, the twenty-ninth transistor T29 and the thirty-third transistor T30 are all turned on, and the twenty-first transistor T21, the twenty-second transistor T22, the twenty-third transistor T23, the twenty-sixth transistor T26 and the twenty-seventh transistor T27 are all turned off. The pull-down control node PDC and the pull-down node PD are both at a low level, and the pull-up node PU is at a high level. The high-level operating voltage VGH is written to the signal output terminal OUT through the twenty-eighth transistor T28, and thus the signal output terminal OUT outputs a high-level signal.

During the holding stage p6, the input signal terminal INPUT provides a high-level signal, the third clock signal terminal CLKM provides a clock signal switching between high/low levels, and the fourth clock signal terminal CLKN provides a clock signal switching between high/low levels. The pull-up node PU is always at a high level, the pull-down node PD is always at a low level, the twenty-eighth transistor T28 is kept to be turned on, the twenty-seventh transistor T27 is kept to be turned off, and the signal output terminal OUT keeps outputting a high-level signal.

In some implementations, the signal output terminal OUT of the third shift register at the $i^{th}$ stage is coupled to the third input signal terminal INPUT at the $(i+1)^{th}$ stage to make the two third shift registers be coupled in cascade. The signal input terminal INPUT of the third shift register at the first stage in the light-emitting control driving circuit is coupled to a third frame start signal terminal STV".

In the present disclosure, by controlling waveforms of frame start signals provided by the first frame start signal terminal STV', the second frame start signal terminal STV ', and the third frame start signal terminal STV", respectively, waveforms of scanning signals output from the first shift register, the second shift register, and the third shift register can be controlled.

Figure 15:
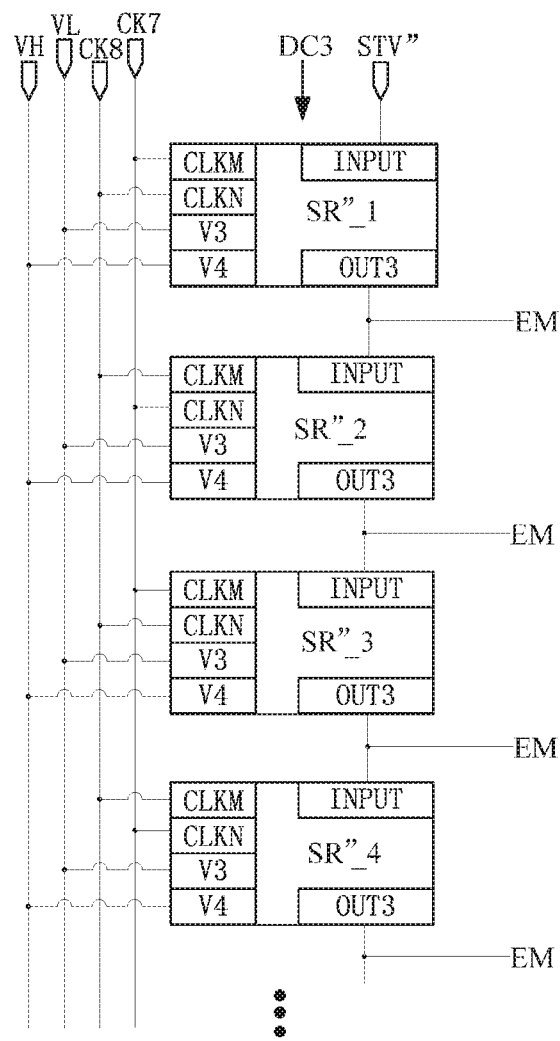
FIG. 15 is a schematic structural diagram of a light-emitting control driving circuit and signal lines thereof according to an embodiment of the present disclosure.
Figure 16:
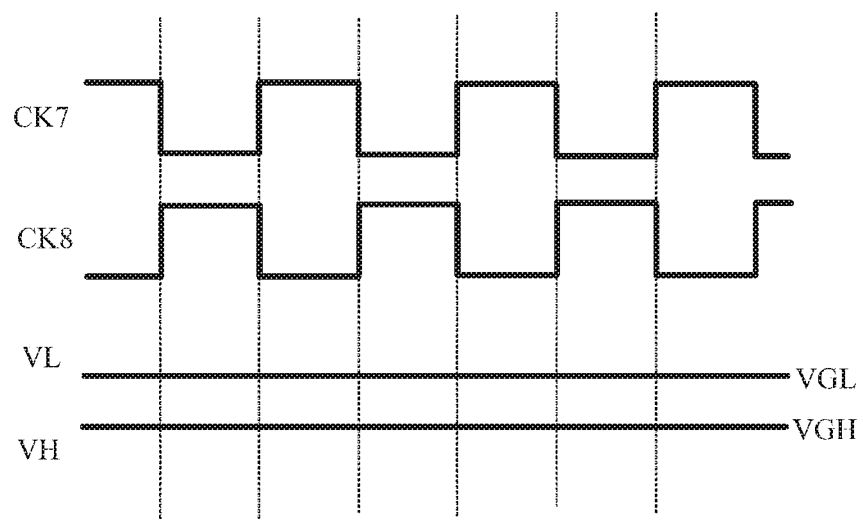
FIG. 16 is a waveform diagram of signals carried by four signal lines in FIG. 15.

FIG. 15 is a schematic structural diagram of the light-emitting control driving circuit DC3 and signal lines thereof according to an embodiment of the present disclosure, FIG. 16 is a waveform diagram of signals carried by four signal lines in FIG. 15, and as shown in FIG. 15 and FIG. 16, the light-emitting control driving circuit DC3 is configured with two clock signal lines and two operating voltage signal lines, i.e., a seventh clock signal line CK7, an eighth clock signal line CK8, a high-level operating voltage signal line VH, and a low-level operating voltage signal line VL.

The third clock signal terminal CLKM of the third shift register at the $(2m-1)^{th}$ stage is coupled to the seventh clock signal line CK7, and the second clock signal terminal CLKB of the third shift register at the $(2m-1)^{th}$ stage is coupled to the eighth clock signal line CK 8.

The third clock signal terminal CLKM of the third shift register at the $2m^{th}$ stage is coupled to the eighth clock signal line CK8, and the second clock signal terminal CLKB of the third shift register at the $2m^{th}$ stage is coupled to the seventh clock signal line CK 7, where m is an integer and is greater than or equal to 1 and less than or equal to N/2.

The third operating voltage terminal V3 of each stage of the shift register is coupled to the low-level operating voltage signal line VL, and the fourth operating voltage terminal V4 of each stage of the shift register is coupled to the high-level operating voltage signal line VH.

A time period during which the clock signal provided by the seventh clock signal line CK7 is at an active level is staggered from a time period during which the clock signal provided by the eighth clock signal line CK8 is at an active level, the low-level operating voltage signal line VL provides a low-level operating voltage VGL, and the high-level operating voltage signal line VH provides a high-level operating voltage VGH.

An embodiment of the present disclosure further provides a display driving method, based on the display substrate provided in the foregoing embodiment, the display driving method includes: sequentially outputting, by the gate driving circuit, gate scanning signals through the N first signal output terminals, and sequentially outputting, by the reset driving circuit, reset scanning signals through the N second signal output terminals. The scanning timing of the second reset signal line configured for the $i^{th}$ pixel unit group is the same as the scanning timing of the first reset signal line configured for the $(i+1)^{th}$ pixel unit group.

In some implementations, the scanning timing of the gate line configured for the $i^{th}$ pixel unit group is the same as the scanning timing of the second reset signal line configured for the $i^{th}$ pixel unit group.

In some implementations, when the driving module includes the light-emitting control driving circuit, the light-emitting control driving circuit may further sequentially output light-emitting control scanning signals through the N third signal output terminals during a display driving process.

In the driving process, the specific operating process of the pixel unit can refer to the corresponding content in the foregoing embodiment, and is not described herein again.

An embodiment of the present disclosure further provides a display device, including the display substrate provided by the embodiment of the present disclosure.

The display device may be any product or component with a display function, such as electronic paper, an OLED panel, an AMOLED panel, a mobile phone, a tablet computer, a television, a display, a notebook computer, a digital photo frame, and a navigator.

Example embodiments have been disclosed herein, and although specific terms are employed, they are used and should be interpreted in a generic and descriptive sense only and not for purposes of limitation. In some instances, features, characteristics and/or elements described in connection with a particular embodiment may be used alone or in combination with features, characteristics and/or elements described in connection with another embodiment, unless expressly stated otherwise, as would be apparent to one skilled in the art. It will, therefore, be understood by those skilled in the art that various changes in form and details may be made without departing from the scope of the present disclosure as set forth in the appended claims.

The invention claimed is:

1. A display substrate, comprising: a display area and a peripheral area surrounding the display area, wherein a plurality of pixel units which are arranged in an array mode are arranged in the display area, all the pixel units are divided into N pixel unit groups, N is an integer and is greater than or equal to 2, and each pixel unit group is provided with a corresponding gate line, a first reset signal line and a second reset signal line; a driving module is arranged in the peripheral area, the driving module comprises at least two driving circuits, at least two operating signal line groups corresponding to the driving circuits in one-to-one mode are further arranged in the peripheral area, each operating signal line group comprises at least two operating signal lines, and the operating signal lines are configured to provide electric signals for the corresponding driving circuits;

the driving circuits and the operating signal line groups are alternately arranged, and each driving circuit is adjacent to the operating signal line group corresponding thereto;
the at least two driving circuits comprise: a gate driving circuit provided with N first signal output terminals capable of sequentially outputting gate scanning signals, and a reset driving circuit provided with N second signal output terminals capable of sequentially outputting reset scanning signals;
ith first signal output terminal is coupled to the gate line configured for ith pixel unit group, ith second signal output terminal is coupled to the second reset signal line configured for the ith pixel unit group and the first reset signal line configured for (i+1)th pixel unit group, Nth first signal output terminal and Nth second signal output terminal are respectively coupled to the gate line and the second reset signal line configured for Nth pixel unit group, wherein i is an integer and is greater than or equal to 1 and less than or equal to N-1.

2. The display substrate according to claim 1, wherein the gate driving circuit comprises N first shift registers coupled in cascade, and the reset driving circuit comprises N second shift registers coupled in cascade;
signal output terminal of first shift register at jth stage is jth first signal output terminal;
signal output terminal of second shift register at jth stage is jth second signal output terminal;
wherein j is an integer and is greater than or equal to 1 and less than or equal to N.

3. The display substrate according to claim 2, wherein the N pixel unit groups are arranged in a first direction;

the gate line, the first reset signal line and the second reset signal line all extend along a second direction;
the N first shift registers in the gate driving circuit are arranged along the first direction, and the N first shift registers in the reset driving circuit are arranged along the first direction;
the first direction intersects the second direction.

4. The display substrate according to claim 2, wherein the first shift register comprises: a first input sub-circuit, a first pull-down control sub-circuit, a first output sub-circuit and a first pull-down sub-circuit;
the first input sub-circuit is coupled to an input signal terminal, a pull-up node and a first clock signal terminal and is configured to write an input signal provided by the input signal terminal into the pull-up node in response to control of the first clock signal terminal;
the first pull-down control sub-circuit is coupled to a first operating voltage terminal, the pull-up node, a pull-down node and the first clock signal terminal, and is configured to write a first operating voltage provided by the first operating voltage terminal into the pull-down node in response to control of the first clock signal terminal, and write a first clock signal provided by the first clock signal terminal into the pull-down node in response to control of voltage at the pull-up node;
the first output sub-circuit is coupled to a second operating voltage terminal, the pull-up node, the pull-down node, a signal output terminal and a second clock signal terminal, and is configured to write a second clock signal provided by the second clock signal terminal into the signal output terminal in response to control of voltage at the pull-up node, and write a second operating voltage provided by the second operating voltage terminal into the signal output terminal in response to control of the pull-down node;
the first pull-down sub-circuit is coupled to the second operating voltage terminal, the pull-up node, the pull-down node and the second clock signal terminal, and is configured to write the second operating voltage into the pull-up node in response to control of a voltage at the pull-down node and the second clock signal terminal.

5. The display substrate according to claim 4, wherein the operating signal line group corresponding to the gate driving circuit comprises: a first clock signal line, a second clock signal line, a third clock signal line, and a fourth clock signal line;
the first clock signal terminal of the first shift register at (4k-3)th stage is coupled to the first clock signal line, and the second clock signal terminal of the first shift register at the (4k-3)th stage is coupled to the second clock signal line;
the first clock signal terminal of the first shift register at (4k-2)th stage is coupled to the second clock signal line, and the second clock signal terminal of the first shift register at the (4k-2)th stage is coupled to the first clock signal line;
the first clock signal terminal of the first shift register at (4k-1)th stage is coupled to the third clock signal line, and the second clock signal terminal of the first shift register at the (4k-1)th stage is coupled to the fourth clock signal line;
the first clock signal terminal of the first shift register at 4kth stage is coupled to the fourth clock signal line, and the second clock signal terminal of the first shift register at the 4kth stage is coupled to the third clock signal line;
wherein k is an integer and is greater than or equal to 1 and less than or equal to N/4;

a time period during which a clock signal provided by the first clock signal line is at an active level is staggered from a time period during which a clock signal provided by the second clock signal line is at an active level;

the first clock signal line and the third clock signal line provide clock signals the same as each other, and the second clock signal line and the fourth clock signal line provide clock signals the same as each other.

6. The display substrate according to claim 4, wherein a circuit of the second shift register is the same as a circuit of the first shift register.

7. The display substrate according to claim 6, wherein the operating signal line group corresponding to the reset driving circuit comprises: a fifth clock signal line and a sixth clock signal line;

the first clock signal terminal of the second shift register at (2m-1)th is coupled to the fifth clock signal line, and the second clock signal terminal of the second shift register at the (2m-1)th is coupled to the sixth clock signal line;

the first clock signal terminal of the second shift register at 2mth stage is coupled to the sixth clock signal line, and the second clock signal terminal of the second shift register at the 2mth stage is coupled to the fifth clock signal line;

wherein m is an integer and is greater than or equal to 1 and less than or equal to N/2;

a time period during which a clock signal provided by the fifth clock signal line is at an active level is staggered from a time period during which a clock signal provided by the sixth clock signal line is at an active level.

8. The display substrate according to claim 1, wherein each of the pixel unit groups is provided with a corresponding light-emitting control signal line;

the driving module further comprises a light-emitting control driving circuit which is provided with N third signal output terminals capable of sequentially outputting light-emitting control scanning signals;

jth first signal output terminal is coupled to the light-emitting control signal line configured for jth pixel unit group, j is an integer and is greater than or equal to 1 and less than or equal to N.

9. The display substrate according to claim 8, wherein the light-emitting control driving circuit comprises N third shift registers coupled in cascade;

signal output terminal of the third shift register at jth stage is jth third signal output terminal.

10. The display substrate according to claim 9, wherein the N pixel unit groups are arranged in a first direction;

the N third shift registers in the light-emitting control driving circuit are arranged along the first direction.

11. The display substrate according to claim 8, wherein the N pixel unit groups are arranged in a first direction;

within the driving module, the gate driving circuit, the reset driving circuit and the light-emitting control driving circuit are arranged in a second direction;

the first direction intersects the second direction.

12. The display substrate according claim 1, wherein two driving modules are provided, and the two driving modules are respectively located at opposite sides of the display area.

13. The display substrate according to claim 1, wherein the pixel units comprises: a pixel circuit and a light-emitting device, the pixel circuit comprises a first reset sub-circuit, a second reset sub-circuit, a data writing sub-circuit, a threshold compensation sub-circuit, and a driving transistor;

the first reset sub-circuit is coupled to a first power supply terminal, a control electrode of the driving transistor and the corresponding first reset signal line, and is configured to write a first voltage provided by the first power supply terminal into the control electrode of the driving transistor in response to control of the first reset signal line;

the second reset sub-circuit is coupled to the first power supply terminal, a first terminal of the light-emitting device and the corresponding second reset signal line, and is configured to write the first voltage into the first terminal of the light-emitting device in response to control of the second reset signal line and;

the data writing sub-circuit is coupled to a first electrode of the driving transistor, a corresponding data line and the corresponding gate line and is configured to write a data voltage provided by the data line into the first electrode of the driving transistor in response to control of the gate line;

the threshold compensation sub-circuit is coupled to a second power supply terminal, a control electrode of the driving transistor, the first electrode of the driving transistor, a second electrode of the driving transistor and the corresponding gate line, and is configured to write a data compensation voltage into the control electrode of the driving transistor in response to control of the gate line, wherein the data compensation voltage is equal to a sum of the data voltage and a threshold voltage of the driving transistor;

the second electrode of the driving transistor is coupled to the first terminal of the light-emitting device, and the driving transistor is configured to output corresponding driving current in response to control of the data compensation voltage;

a second terminal of the light-emitting device is coupled to a third power supply terminal.

14. The display substrate of claim 13, wherein the first reset sub-circuit comprises a first transistor, the second reset sub-circuit comprises a second transistor, the data writing sub-circuit comprises a third transistor, the threshold compensation sub-circuit comprises a fourth transistor and a fifth transistor;

a control electrode of the first transistor is coupled to the first reset signal line, a first electrode of the first transistor is coupled to the first power supply terminal, and a second electrode of the first transistor is coupled to the control electrode of the driving transistor;

a control electrode of the second transistor is coupled to the second reset signal line, a first electrode of the second transistor is coupled to the first power supply terminal, and a second electrode of the second transistor is coupled to the first terminal of the light-emitting device;

a control electrode of the third transistor is coupled to the gate line, a first electrode of the third transistor is coupled to the data line, and a second electrode of the third transistor is coupled to the first electrode of the driving transistor;

a control electrode of the fourth transistor is coupled to a light-emitting control signal line, a first electrode of the fourth transistor is coupled to the second power supply terminal, and a second electrode of the fourth transistor is coupled to the first electrode of the driving transistor;

a control electrode of the fifth transistor is coupled to the gate line, a first electrode of the fifth transistor is coupled to the control electrode of the driving transistor, and a second electrode of the fifth transistor is coupled to the second electrode of the driving transistor.

15. The display substrate according to claim 14, wherein each of the pixel unit groups is provided with a corresponding light-emitting control signal line, the pixel circuit further comprises a sixth transistor through which the second electrode of the driving transistor is coupled to the first terminal of the light-emitting device;

a control electrode of the sixth transistor is coupled to the light-emitting control signal line, a first electrode of the sixth transistor is coupled to the second electrode of the driving transistor, and a second electrode of the sixth transistor is coupled to the first terminal of the light-emitting device.

16. A display device, comprising: the display substrate according to claim 1.

17. A display driving method based on the display substrate of claim 1, the display driving method comprising:

sequentially outputting, by the gate driving circuit, gate scanning signals through N first signal output terminals, sequentially outputting, by the reset driving circuit, reset scanning signals through N second signal output terminals, and a scanning timing of the second reset signal line configured for the ith pixel unit group is the same as a scanning timing of the first reset signal line configured for the (i+1)th pixel unit group.

18. The display driving method according to claim 17, wherein a scanning timing of the gate line configured for the ith pixel unit group is the same as a scanning timing of the second reset signal line configured for the ith pixel unit group.

* * * * *

UNITED STATES PATENT AND TRADEMARK OFFICE
CERTIFICATE OF CORRECTION

| | | |
|---|---|---|
| PATENT NO. | : 11,783,782 B2 | Page 1 of 1 |
| APPLICATION NO. | : 17/040111 | |
| DATED | : October 10, 2023 | |
| INVENTOR(S) | : Wenkang Wang et al. | |

It is certified that error appears in the above-identified patent and that said Letters Patent is hereby corrected as shown below:

On the Title Page

Item (73), please remove the Assignees in the current order and replace with the correct order as follows: "Chengdu BOE Optoelectronics Technology Co., Ltd. , Chengdu (CN)" and "BOE Technology Group Co., Ltd., Beijing (CN)".

Signed and Sealed this
Twentieth Day of February, 2024

Katherine Kelly Vidal
*Director of the United States Patent and Trademark Office*